(12) United States Patent
Babaie et al.

(10) Patent No.: US 9,397,613 B2
(45) Date of Patent: Jul. 19, 2016

(54) SWITCHING CURRENT SOURCE RADIO FREQUENCY OSCILLATOR

(71) Applicants: Masoud Babaie, Pijnacker (NL);
Robert Bogdan Staszewski, Dublin (IE)

(72) Inventors: Masoud Babaie, Pijnacker (NL);
Robert Bogdan Staszewski, Dublin (IE)

(73) Assignee: Short Circuit Technologies LLC, Rochester, NY (US)

( * ) Notice: Subject to any disclaimer, the term of this patent is extended or adjusted under 35 U.S.C. 154(b) by 0 days.

(21) Appl. No.: 14/874,401

(22) Filed: Oct. 3, 2015

(65) Prior Publication Data

US 2016/0099679 A1 Apr. 7, 2016

Related U.S. Application Data

(60) Provisional application No. 62/059,415, filed on Oct. 3, 2014.

(51) Int. Cl.
*H03B 5/12* (2006.01)
*H03L 7/081* (2006.01)
*H03L 7/099* (2006.01)

(52) U.S. Cl.
CPC ............ *H03B 5/1212* (2013.01); *H03B 5/124* (2013.01); *H03B 5/1228* (2013.01); *H03B 5/1265* (2013.01); *H03B 5/1281* (2013.01); *H03B 5/1293* (2013.01); *H03L 7/081* (2013.01); *H03L 7/0991* (2013.01)

(58) Field of Classification Search
CPC .... H03B 5/1212; H03B 5/124; H03B 5/1256; H03B 5/1268; H03B 5/1296
USPC ................. 331/117 FE, 117 R, 167
See application file for complete search history.

(56) References Cited

U.S. PATENT DOCUMENTS

| 7,710,211 | B2 * | 5/2010 | Jang ....................... | H03B 19/14 331/116 FE |
| 8,736,392 | B2 * | 5/2014 | Taghivand .............. | H03L 7/099 331/117 FE |
| 2004/0066236 | A1 * | 4/2004 | Fujimoto ............. | H03B 5/1841 330/302 |
| 2011/0273239 | A1 | 11/2011 | Lee | |
| 2012/0268219 | A1 * | 10/2012 | Czimmek ............ | H03B 5/1212 331/117 FE |

(Continued)

FOREIGN PATENT DOCUMENTS

RU          2277745         6/2006

OTHER PUBLICATIONS

Hegazi, E. et al., "A Filtering Technique to Lower LC Oscillator Phase Noise", IEEE JSSC, vol. 36, No. 12, pp. 1921-1930, Dec. 2001.

(Continued)

*Primary Examiner* — Jeffrey Shin
(74) *Attorney, Agent, or Firm* — Zaretsky Patent Group PC; Howard Zaretsky

(57) ABSTRACT

A novel and useful RF oscillator suitable for use in applications requiring ultra-low voltage and power. The oscillator structure, employing alternating current source transistors, combines the benefits of low supply voltage operation of conventional NMOS cross-coupled oscillators together with high current efficiency of the complementary push-pull oscillators. In addition, the 1/f noise upconversion is also reduced. The oscillator can be incorporated within a wide range of circuit applications, including for example a conventional phase locked loop (PLL), all-digital phase-locked loop (ADPLL), wireline transceiver circuits and mobile devices.

20 Claims, 14 Drawing Sheets

(56) References Cited

U.S. PATENT DOCUMENTS

2013/0307630 A1* 11/2013 Ma .......................... H03J 3/20
    331/34
2014/0139395 A1   5/2014 Solondz
2015/0364242 A1* 12/2015 Aboush ................ H03L 7/099
    336/192

OTHER PUBLICATIONS

Kwok, K. et al., "Ultra-Low-Voltage High-Performance CMOS VCOs Using Transformer Feedback", IEEE JSSC, vol. 40, No. 3, pp. 652-660, Mar. 2005.

Okada, K. et al., "A 0.114-mW Dual-Conduction Class-C CMOS VCO with 0.2-V Power Supply", Symp on VLSI Circuits 2009, pp. 228-229, 2009.

Fanori, L. et al., "A 6.7-to-9.2GHz 55nm CMOS Hybrid Class-B/Class-C Cellular TX VCO", ISSCC 2012, pp. 354-355, 2012.

Visweswaran, A. et al.,"A Clip-and-Restore Technique for Phase Desensitization in a 1.2V 65nm CMOS Oscillator for Cellular Mobile and Base Stations",ISSCC 2012,pp. 350-351,2012.

Fanori, L. et al., "A High-Swing Complementary Class-C VCO", ESSCIRC 2013, pp. 407-410, Sep. 2013.

Mazzanti, A. et al., "A Push-Pull Class-C CMOS VCO", IEEE JSSC, vol. 48, No. 3, pp. 724-732, Mar. 2013.

Tohidian, M. et al., "Dual-Core High-Swing Class-C Oscillator with Ultra-Low Phase Noise", RFIC 2013, pp. 243-246, 2013.

Visweswaran, A. et al., "A Low Phase Noise Oscillator Principled on Transformer-Coupled Hard Limiting", IEEE JSSC, vol. 49, No. 2, pp. 373-383, Feb. 2014.

Li, G. et al., "A Low-Phase-Noise Wide-Tuning-Range Oscillator Based on Resonant Mode Switching", IEEE JSSC, vol. 47, No. 6, pp. 1295-1308, Jun. 2012.

Fanori, L. et al., "Class-D CMOS Oscillators", IEEE JSSC, vol. 48, No. 12, pp. 3105-3119, Dec. 2013.

Mazzanti, A. et al., "Class-C Harmonic CMOS VCOs, With a General Result on Phase Noise", IEEE JSSC, vol. 43, No. 12, pp. 2716-2729, Dec. 2008.

Fanori, L. et al., "A 2.5-to-3.3GHz CMOS Class-D VCO", ISSCC 2013, pp. 346-347, 2013.

Babaie, M. et al., "A Class-F CMOS Oscillator", IEEE JSSC, vol. 48, No. 12, pp. 3120-3133, Dec. 2013.

Babaie, M. et al., "Third-Harmonic Injection Technique Applied to a 5.87-to-7.56GHz 65nm CMOS Class-F Oscillator with 192dBc/Hz FOM", ISSCC 2013, pp. 348-349, 2013.

Fanori, L. et al., "Highly Efficient Class-C CMOS VCOs, Including a Comparison With Class-B VCOs", IEEE JSSC, vol. 48, No. 7, pp. 1730-1740, Jul. 2013.

Chillara, V.K. et al., "An 860µW 2.1-to-2.7GHz All-Dig PLL-Based Freq Mod with a DTC-Assisted Snapshot TDC for WPAN (Bluetooth Smart and Zigbee) Appls",ISSCC,pp. 172-173,2014.

Klumperink, E.A.M. et al., "Reducing MOSFET 1/f Noise and Power Consumption by Switched Biasing," IEEE J. Solid-State Circuits, vol. 35, No. 7, pp. 994-1001, Jul. 2000.

Yoshihara, Y. et al., "A 0.171-mW, 2.4-GHz Class-D VCO with Dynamic Supply Voltage Control," Proc. ESSCIRC, pp. 339-342, Sep. 2014.

PCT/US2015/053891, Written Opinion, Jan. 14, 2016.

\* cited by examiner

SWITCHING CURRENT SOURCE RADIO FREQUENCY OSCILLATOR

REFERENCE TO PRIORITY APPLICATION

This application claims priority to U.S. Provisional Application Ser. No. 62/059,415, filed Oct. 3, 2014, entitled "Oscillators," incorporated herein by reference in its entirety.

FIELD OF THE INVENTION

The present invention relates generally to oscillator circuits and in particular to an RF oscillator employing a current source that is used to reverse the direction of the LC tank current every half period.

BACKGROUND OF THE INVENTION

The Internet of Things (IoT) is a network or physical objects or "things" embedded with electronics, software, sensors and network connectivity that enable these devices to collect and exchange data. The IoT is expected to explode in the coming years as the hardware and software embedded in these objects and things become smaller and cheaper. A critical component of IoT devices is the transceiver which must be small in physical size, low cost and consume a relatively small amount of power due to the availability of a small battery or alternatively no battery where the device is solely powered by an energy harvester.

Ultra low power (ULP) transceivers underpin short-range communications for wireless internet-of-things (IoT) applications. Their system lifetime, however, is extremely limited by the transceiver power consumption and available battery technology. On the other hand, energy harvesting technologies typically deliver supply voltages that are much lower than the standard supply voltage of CMOS circuits; e.g., on-chip solar cells can supply only 200-800 mV. Although boost converters can bring the level up to the required ~1 V, their poor efficiency (<80%) wastes most of the harvested energy. Consequently, RF oscillators, as one of the transceiver's most power hungry circuit blocks, must be very power efficient and preferably operate directly at the energy harvester output.

There is thus a need for an RF oscillator suitable for use with ultra low power transceivers that addresses the aforementioned constraints. Such an RF oscillator (1) exhibits ultra low power consumption, (2) operates at ultra low voltage, (3) is small in physical size, (4) is manufacturable and at low cost and (5) does not sacrifice phase purity.

SUMMARY OF THE INVENTION

The present invention is an RF oscillator having a switching current source topology which is suitable for use in applications requiring ultra-low voltage and power. The oscillator structure, employing alternating current source transistors, combines the benefits of low supply voltage operation of conventional NMOS cross-coupled oscillators together with high current efficiency of the complementary push-pull oscillators. In addition, the 1/f noise upconversion is also reduced.

The oscillator uses two pairs of transistors (lower $M_{1,2}$ and upper $M_{3,4}$) stacked one on top of the other with cross coupled gate terminals so as to realize positive feedback. The oscillator employs a two port resonator coupled between the gates and source terminals of the upper transistors and the gate and drain terminals of the lower transistors. In one embodiment, the resonator consists of a step-up 1:2 transformer and tuning capacitors at its primary and secondary windings. Alternatively, a capacitive divider or autotransformer may be used as well.

To realize positive feedback, the out-of-phase ports of the primary and secondary windings are respectively connected to the drain and gate of gm devices ($M_{1/2}$). The in-phase signals, however, are applied to switchable current source devices ($M_{3/4}$) to force them working only in saturation during the on-state. Consequently, only one side of the tank is connected to the ac ground during the operation of $M_{1/2}$ in the linear region while the other side sees high impedance. Thus, this structure preserves the tank's charge and Q-factor over the entire oscillation period. Nevertheless, like a push-pull structure, the tank current flow is reversed in each half period and thus doubles the oscillator $\alpha_I$ to $4/\pi$. On the other hand, the supply and drain oscillation voltage could respectively be as low as $2V_t\text{-}V_{OD3}$ and $V_t\text{-}V_{OD3}$. Consequently, the $V_{DDmin}^2 \cdot \alpha_V/\alpha_I$ term reduces by approximately three times compared to prior art oscillator structures. This means the $P_{osc}$ can be three times lower for the same $R_{intank}$ (i.e. the inductor) or the inductor value can be reduced about three times, which translates to a better tank Q-factor and oscillator phase noise (PN) and figure of merit (FoM).

The oscillator can be incorporated within a wide range of circuit applications, including for example a conventional phase locked loop (PLL), all-digital phase-locked loop (AD-PLL), wireline transceiver circuits and mobile devices.

There is thus provided in accordance with the invention, an oscillator circuit, comprising a lower pair of transistors, an upper pair of transistors, each transistor in the upper pair stacked on a respective transistor in the lower pair, a gate terminal of each transistor in the upper pair coupled with a respective gate terminal of transistors in the lower pair, an LC-tank circuit coupled between the gate terminals of the transistors and drain terminals of the lower pair, the an LC-tank circuit having a passive voltage gain, and wherein the direction of tank current reverses direction every half period.

There is also provided in accordance with the invention, an oscillator circuit comprising a lower pair of transistors, an upper pair of transistors, each transistor in said upper pair stacked on a respective transistor in said lower pair, a gate terminal of each transistor in said upper pair coupled with a respective gate terminal of transistors in said lower pair, an LC-tank circuit coupled between the gate terminals of the transistors in said upper pair and drain terminals of said lower pair, said LC-tank circuit having a passive voltage gain, and wherein said upper pair of transistors and said lower pair of transistors are operative to cause current through said LC-tank to reverse direction every half period.

There is further provided in accordance with the invention, an oscillator circuit, comprising a lower pair of transistors, an upper pair of transistors, a source of each transistor in the upper pair coupled to a drain of a respective transistor in the lower pair, a gate terminal of each transistor in the upper pair coupled with a respective gate terminal of transistors in the lower pair, a differential tank circuit including a transformer having a primary winding and a secondary winding and exhibiting a passive voltage gain, the primary winding coupled to drain terminals of the lower pair and the secondary winding coupled to the gate terminals of the transistors, a first tunable capacitor coupled across the primary winding, a second tunable capacitor coupled across the secondary winding, and wherein the direction of tank current reverses direction every half period.

BRIEF DESCRIPTION OF THE DRAWINGS

The invention is herein described, by way of example only, with reference to the accompanying drawings, wherein.

DETAILED DESCRIPTION OF THE INVENTION

Oscillator Power Consumption Tradeoffs

The phase noise (PN) of the traditional oscillator (i.e. class-B) with an ideal current source at an offset frequency $\Delta\omega$ from its resonating frequency $\omega_0$ can be expressed as $$\mathcal{L}(\Delta\omega) = 10\log_{10}\left(\frac{KT}{2Q_t^2 \alpha_I \alpha_V P_{DC}}(1+\gamma)\left(\frac{\omega_0}{\Delta\omega}\right)^2\right) \quad (1)$$

where, $Q_t$ is the LC-tank quality factor; $\alpha_I$ is the current efficiency, defined as ratio of the fundamental current harmonic $I_{\omega_0}$ over the oscillator DC current $I_{DC}$; and $\alpha_V$ is the voltage efficiency, defined as ratio of the drain oscillation amplitude $V_{osc}$ (single-ended) over the supply voltage $V_{DD}$. As a consequence, $V_{osc}$ can be calculated by one of the following equations $$V_{osc} = \alpha_V V_{DD} = R_{in} I_{\omega_0} = R_{in} \alpha_I I_{DC} \quad (2)$$

where, $R_{in}$ is an equivalent input parallel resistance of the tank modeling its losses. Equation 1 demonstrates a trade-off between power consumption $P_{DC}$ and phase noise (PN). The PN requirements are relatively trivial for IoT applications and can be easily met by LC oscillators as long as the Barkhausen start-up criterion is satisfied over process, voltage and temperature (PVT) variations. Consequently, reducing $P_{DC}$ is the ultimate goal of IoT applications. The $I_{DC}$ can be calculated by using the second and last terms of Equation 2, $$I_{DC} = V_{DD} \cdot \frac{\alpha_V}{\alpha_I} \cdot \frac{1}{R_{in}} \quad (3)$$

As a result, the RF oscillator's $P_{DC}$ is derived by the following $$P_{DC} = V_{DD}^2 \cdot \frac{\alpha_V}{\alpha_I} \cdot \frac{1}{R_{in}} \quad (4)$$

Equation 4 indicates that the minimum achievable $P_{DC}$ can be expressed in terms of a set of optimization parameters, such as $R_{in}$, and a set of topology dependent parameters, such as minimum supply voltage ($V_{DDmin}$), current and voltage efficiencies.

Lower $P_{DC}$ is typically achieved by scaling up $R_{in} = L_p \omega_0 Q_t$ simply via a large multi-turn inductor. For example, by continuing to increase the inductance by 2× at constant $Q_t$, $R_{in}$ could theoretically be enhanced by 2×, which would reduce $P_{DC}$ by half with a 3 dB PN degradation. At some point, however, that tradeoff stops due to a dramatic drop in the inductor's self-resonant frequency and Q-factor. This constraint sets an upper limit on maximum $R_{in}$, which is a function of the technology used to implement the oscillator.

Figure 1:
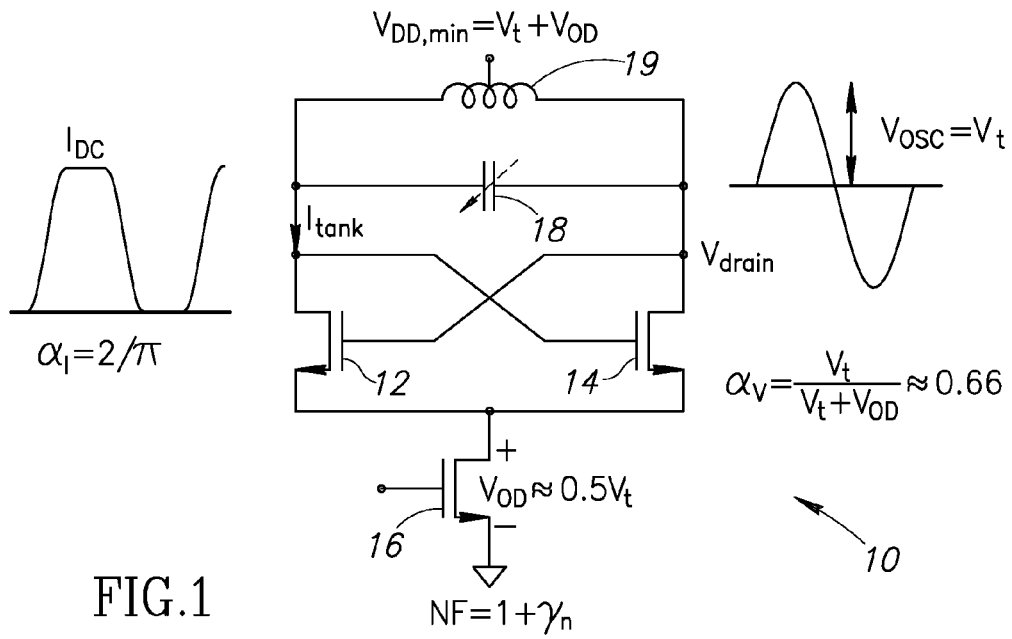
FIG. 1 is a schematic diagram illustrating an example cross-coupled NMOS only oscillator.
Figure 2:
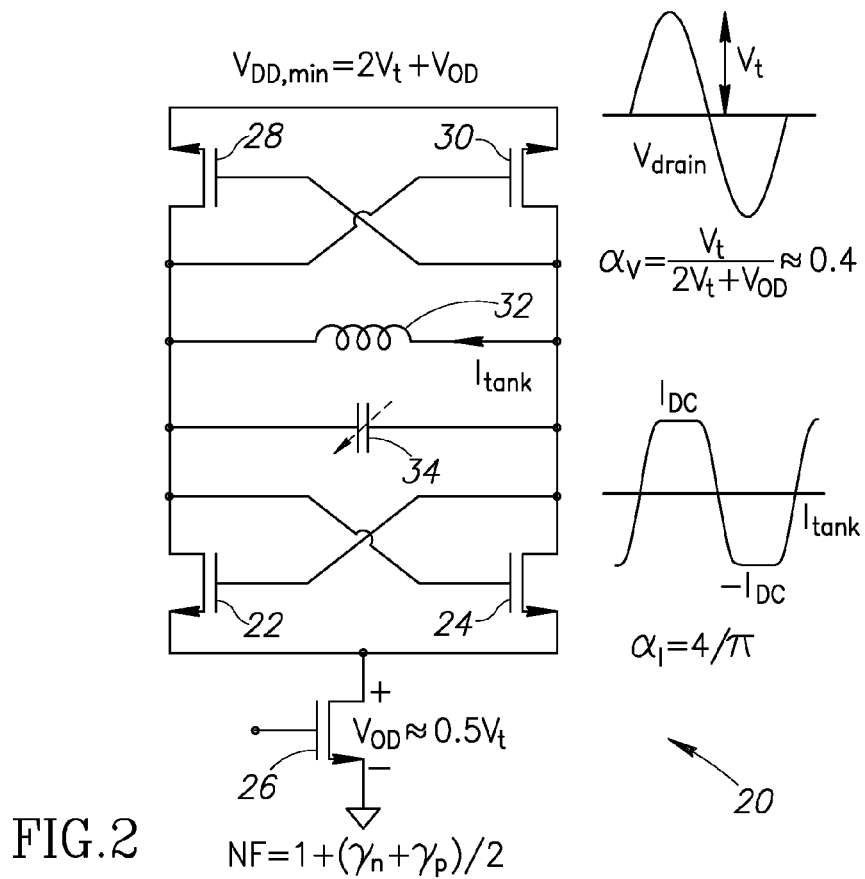
FIG. 2 is a schematic diagram illustrating an example complementary push-pull oscillator.

The topology parameters also play an important role in the minimum achievable $P_{DC}$. A schematic diagram illustrating an example cross-coupled NMOS only oscillator is shown in FIG. 1. A schematic diagram illustrating an example complementary push-pull oscillator is shown in FIG. 2. FIG. 1 shows such effects for a cross-coupled NMOS-only ($OSC_N$) structure while FIG. 2 and shows the effects for a complementary push-pull ($OSC_{NP}$) structure.

With reference to FIG. 1, the oscillator circuit, generally referenced 10, comprises a pair of cross coupled NMOS transistors 12, 14 coupled to a tank comprising inductor 19 and tuning capacitor 18. The current flowing through the transistor pair is determined by transistor 16 whose drain-source overdrive voltage $V_{OD}$ is approximately 0.5 $V_t$ where $V_t$ is the transistor threshold voltage.

With reference to FIG. 2, the oscillator circuit, generally referenced 20, comprises a first pair (i.e., lower pair, since it is closer to $V_{SS}$) of cross coupled NMOS transistors 22, 24 coupled to a second pair (i.e., upper pair, since it is closer to $V_{DD}$) of PMOS transistors 28, 30 stacked thereon. A tank comprising inductor 32 and tuning capacitor 34 is coupled across the drains of the first pair of transistors 22, 24 and the drain terminals of the second pair of transistors 28, 30. The current flowing through the transistor pair is determined by transistor 26 whose overdrive voltage $V_{OD}$ is approximately 0.5 $V_t$ where $V_t$ is the transistor threshold voltage.

Note that the $V_{DDmin}$ of $OSC_N$ is the sum of the threshold voltage $V_t$ and the overdrive voltage $V_{OD}$ which is about 1.5 $V_t$. The current efficiency of the NMOS cross coupled oscillator, however, is relatively low but the voltage efficiency of the $OSC_N$ structure is high.

In contrast, the $V_{DDmin}$ of $OSC_{NP}$ is about $2.5V_t$ which is larger than that of the $OSC_N$ structure. The current efficiency, however, of the complementary cross coupled oscillator ($OSC_{NP}$) is relatively high. In addition, the voltage efficiency of $OSC_{NP}$ is relatively low.

The key parameters of the $OSC_N$ and $OSC_{NP}$ structures including the minimum power $P_{DCmin}$ are summarized in Table 1 below.

TABLE 1

OSCN and OSCNP Parameters

| Topology | $V_{DDmin}$ | $\alpha_V @ V_{DDmin}$ | $\alpha_I$ | $\alpha_V/\alpha_I$ | $P_{DCmin}$ |
|---|---|---|---|---|---|
| $OSC_N$ | $V_t + V_{OD} \approx 1.5 V_t$ | ~0.66 | $2/\pi$ | 1.04 | $2.35 V_t^2/R_{in}$ |
| $OSC_{NP}$ | $2V_t + V_{OD} \approx 2.5 V_t$ | ~0.4 | $4/\pi$ | 0.32 | $2 V_t^2/R_{in}$ |

Thus, the $V_{DDmin}$ of $OSC_N$ is lower than in $OSC_{NP}$. The current efficiency of $OSC_{NP}$, however, is doubled due to the switching of tank current direction every half period. Its voltage efficiency is also smaller. Therefore, $OSC_{NP}$ offers approximately three times lower $\alpha_V/\alpha_I$. Consequently, each of these structures has its own set of advantages and drawbacks such that the minimum achievable $P_{DC}$ according to Equation 4 is almost identical, as shown in Table 2 below.

TABLE 2

Minimum $P_{DC}$ for Different RF Oscillator Topologies

| Topology | $V_{DDmin}$ | $\alpha_V @ V_{DDmin}$ | $\alpha_I$ | $P_{DCmin}$ |
|---|---|---|---|---|
| $OSC_N$ | $V_t + V_{OD} \approx 1.5 V_t$ | ~0.66 | $2/\pi$ | $2.35 V_t^2/R_{in}$ |
| $OSC_{NP}$ | $2V_t + V_{OD} \approx 2.5 V_t$ | ~0.4 | $4/\pi$ | $2 V_t^2/R_{in}$ |
| This work | $V_t + V_{OD} \approx 1.5 V_t$ | ~0.33 | $4/\pi$ | $0.6 V_t^2/R_{in}$ |

In one embodiment, an oscillator circuit is provided that combines the advantages of the low supply voltage operation of the NMOS cross coupled oscillator ($OSC_N$) with the high current efficiency of the complementary push-pull oscillator ($COS_{NP}$) to reduce the oscillator $P_{DC}$ without sacrificing its start-up robustness of loading the Q-factor of the tank. Thus, the fixed current source of the NMOS topology oscillator ($OSC_N$) is converted into a structure with alternating current sources such that the tank current direction changes every half-period. Consequently, the benefits of low supply voltage of the $OSC_N$ topology and the higher $\alpha_I$ of the $OSC_{NP}$ structure are combined to reduce power consumption further than practically possible in either the $OSC_N$ or $OSC_{NP}$ oscillators alone.

Switching Current Source Oscillator

Figure 3A:
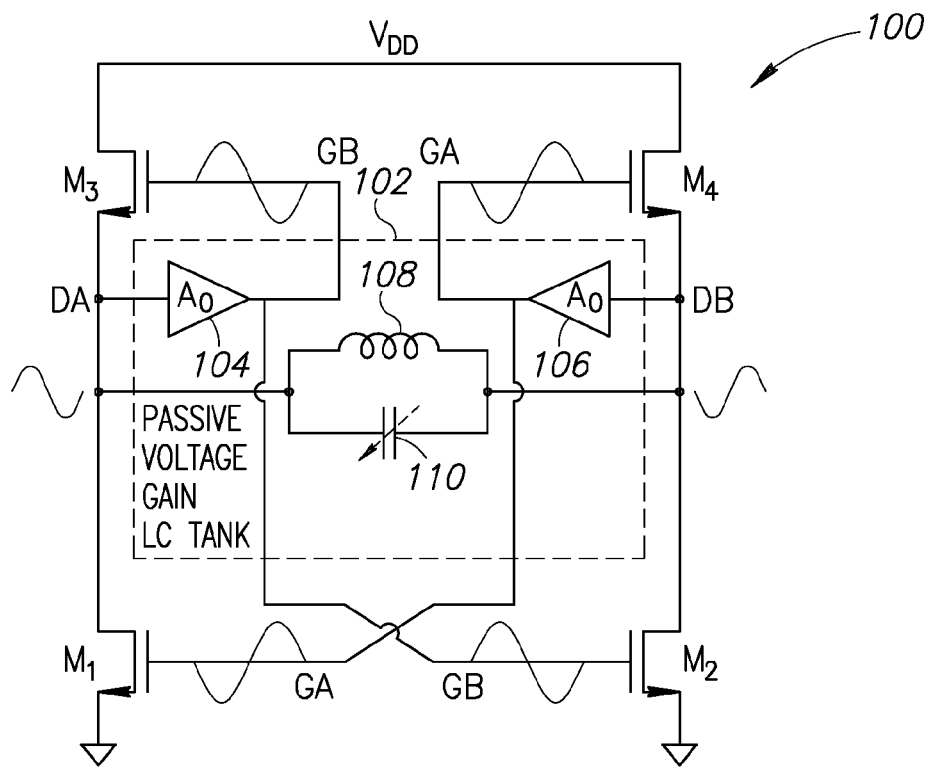
FIG. 3A is a schematic diagram illustrating a first example oscillator of the present invention.

A schematic diagram illustrating a first example oscillator of the present invention is shown in FIG. 3A. The oscillator circuit, generally referenced 100, comprises four similar type transistors (e.g., NMOS or PMOS) $M_1$, $M_2$, $M_3$ and $M_4$, a passive LC tank circuit with voltage gain consisting of gain elements 104, 106 and an LC tank made up of inductor 108 and tuning capacitor 110. $M_1$ and $M_2$ make up a lower pair of transistors and $M_3$ and $M_4$, make up an upper pair of transistors. The lower pair is closer to ground (i.e., $V_{SS}$) while the upper pair is closer to $V_{DD}$. The upper and lower pairs are stacked one on the other with their gate terminals cross-coupled to each other, i.e. the gates of $M_2$ and $M_3$ coupled to each other and the gates of $M_1$ and $M_4$ coupled to each other. The cross-coupling can be achieved using: (1) direct electrical connection; (2) AC coupling via a capacitor; and (3) magnetic coupling via transformer windings.

Figure 3B:
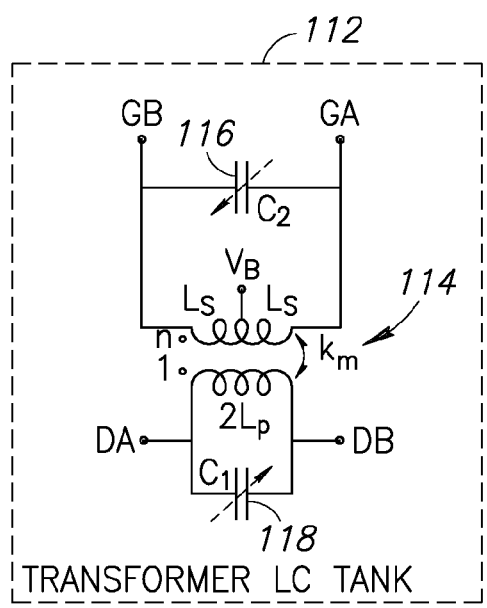
FIG. 3B is a schematic diagram illustrating a transformer based LC tank for the oscillator of FIG. 3A.
Figure 3C:
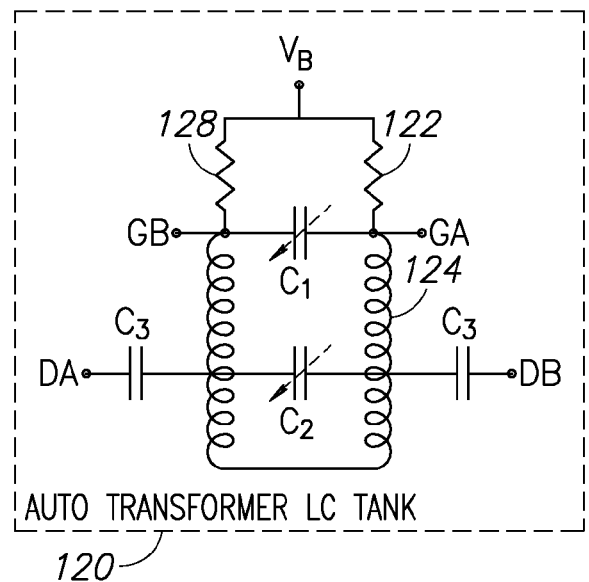
FIG. 3C is a schematic diagram illustrating an auto-transformer based LC tank for the oscillator of FIG. 3A.
Figure 3D:
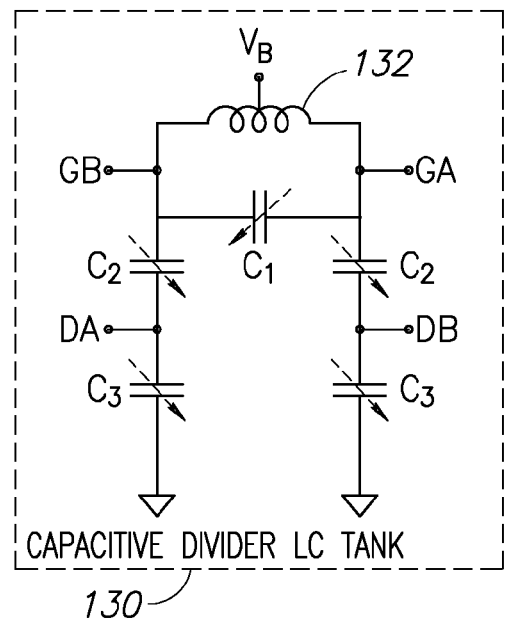
FIG. 3D is a schematic diagram illustrating a capacitive divider based LC tank for the oscillator of FIG. 3A.

To realize positive feedback for both upper and lower transistor pairs, a passive voltage gain is needed between the DA/DB nodes towards the GB/GA nodes. That voltage gain can be realized using any suitable device(s) such as a step-up transformer, capacitive divider or autotransformer. It is noted that the passive voltage gain in an LC tank can be realized using any well-known device(s) and is not limited to the examples provided herein. For example, the passive voltage gain LC tank can be realized using a transformer as shown in FIG. 3B, an autotransformer as shown in FIG. 3C or a capacitive divider circuit as shown in FIG. 3D. In operation, transistors $M_1$, $M_2$, $M_3$ and $M_4$ function to cause the tank current to switch direction each half cycle of the oscillator as described in more detail infra.

A schematic diagram illustrating a transformer based LC tank for the oscillator of FIG. 3A is shown in FIG. 3B. The two-port resonator 112 comprises a step-up 1:n (e.g., 1:2) transformer 114 and tuning capacitors $C_1$, $C_2$ at its primary and secondary windings. The transformer's primary and secondary out-of-phase ports are respectively connected to the drain and gate of $M_1$ and $M_2$ devices. The transformer's in-phase signals, however, must be applied to the source and gate of $M_3$ and $M_4$ devices to realize positive feedback.

A schematic diagram illustrating an auto-transformer based LC tank for the oscillator of FIG. 3A is shown in FIG. 3C. The resonator 120 comprises a differential autotransformer 124 with three tuning capacitor banks $C_1$, $C_2$, $C_3$. $C_3$ capacitors also isolate the DC value of the DA and DB nodes from bias voltage $V_B$. The operating frequency is adjusted by $C_1$ and $C_2$ capacitors. On the other hand, the ratio between the inductance value between upper and lower terminals of the autotransformer over the inductance value between the middle and lower terminals of the auto-transformer determine the amount of the voltage gain of this tank. The voltage and current waveforms of the autotransformer based switching current source oscillator are identical to the transformer based switching current source oscillator.

A schematic diagram illustrating a capacitive divider based LC tank for the oscillator of FIG. 3A is shown in FIG. 3D. The resonator 130 comprises an inductor 132 and three different capacitor banks $C_1$, $C_2$, $C_3$. The $C_2$ and $C_3$ capacitors play an important role of voltage amplification between node DA/DB towards GA/GB. The voltage gain is determined by $1+C_3/C_2$. The voltage and current waveforms of the capacitive divider switching current source oscillator are identical to the transformer based switching current source oscillator.

Figure 4A:
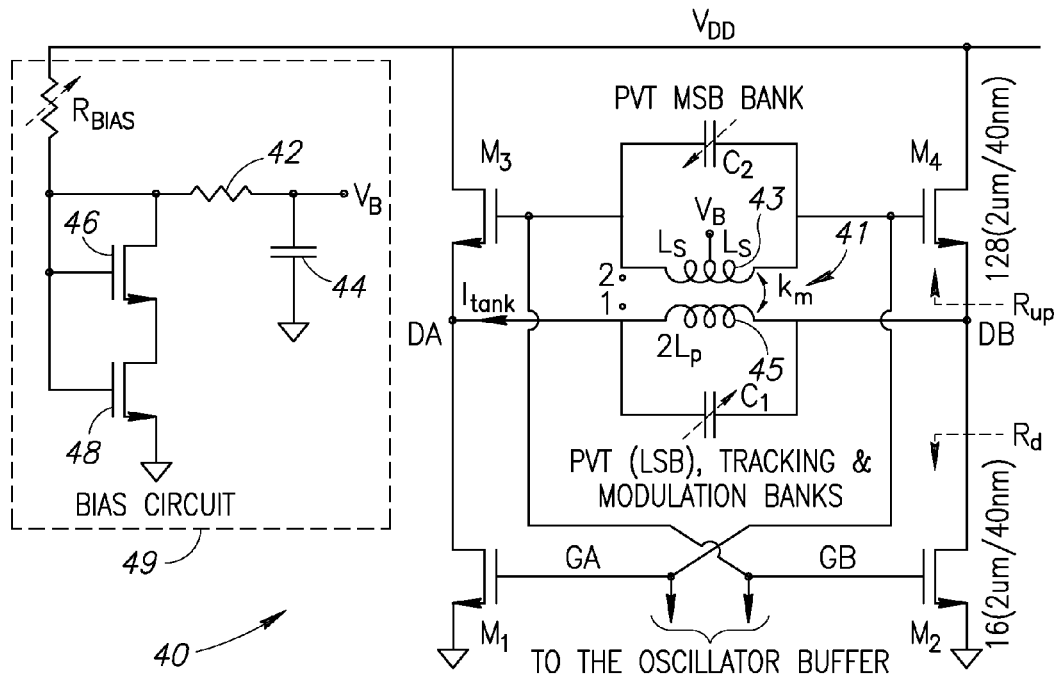
FIG. 4A is a schematic diagram illustrating a second example oscillator of the present invention.
Figure 5:
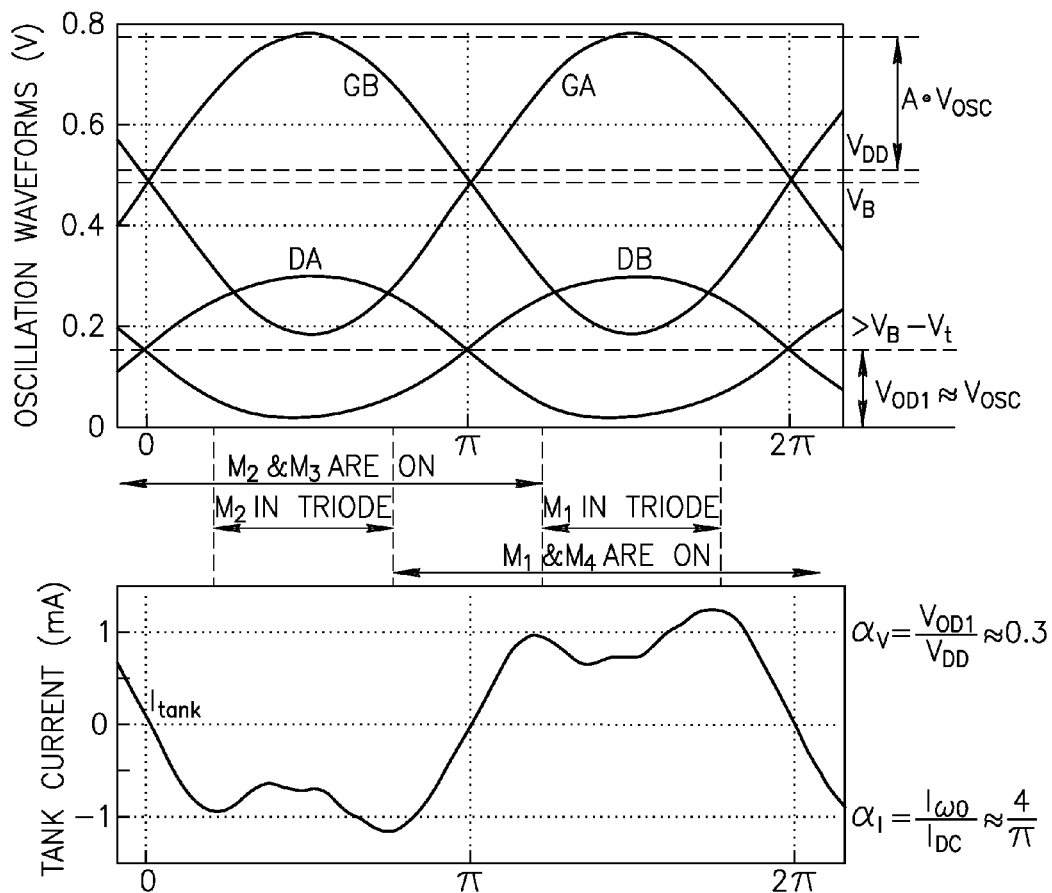
FIG. 5 is a waveform diagram illustrating various waveforms associated with the oscillator of FIG. 4A.

A schematic diagram illustrating a second example oscillator of the present invention is shown in FIG. 4A. A waveform diagram illustrating various waveforms and operational regions of $M_{1-4}$ transistors across the oscillation period associated with the oscillator of FIG. 4A is shown in FIG. 5. The oscillator circuit, generally referenced 40, comprises transistors $M_1$, $M_2$, $M_3$ and $M_4$ of a similar type (e.g., all four NMOS or PMOS), transformer 41 having primary winding 45 and secondary winding 43, tuning capacitor C1 coupled across the primary winding, tuning capacitor C2 coupled across the secondary winding and a bias circuit 49 comprising $R_{Bias}$, transistors 46, 48, resistor 42 and capacitor 44. $M_1$ and $M_2$ make up a lower pair of transistors and $M_3$ and $M_4$, make up an upper pair of transistors. The lower pair is closer to ground while the upper pair is closer to $V_{DD}$. The upper and lower pairs are stacked one on the other with their gate terminals cross-coupled to each other, i.e. the gates of $M_2$ and $M_3$ coupled to each other and the gates of $M_1$ and $M_4$ coupled to each other. To realize positive feedback for both upper and lower transistor pairs, a passive voltage gain is needed between the DA/DB nodes towards the GA/GB nodes. Here, that voltage gain is realized using a step-up transformer.

The oscillator includes a two-port resonator which consists of a step-up 1:2 transformer and tuning capacitors ($C_1$, $C_2$) at its primary and secondary windings, respectively. The current source transistors $M_{1,2}$ function to set the DC current of the oscillator. These devices, along with transistors $M_{3,4}$, play a vital role of switching the tank current direction. To realize that, both transistor pairs $M_{1,2}$ and $M_{3,4}$ must demonstrate a positive feedback mechanism. Consequently, the transformer's primary and secondary out-of-phase ports are respectively connected to the drain and gate of transistor devices $M_{1,2}$. The single-ended output resistance of transistor $M_2$ is given by $$R_d = \frac{r_{o2}}{1 - A \cdot g_{m2} r_{o2}} \xrightarrow{A g_{m2} r_{o2} \gg 1} R_d = \frac{-1}{A \cdot g_{m2}} \quad (5)$$

where, A is the transformer passive voltage gain between its windings. On the other hand, the transformer's in-phase signals must be applied to the source and gate of transistor devices $M_{3,4}$ to realize positive feedback. The real part of the impedance seen at the source of $M_4$ can be expressed by $$R_{up} = \frac{r_{o4}}{1 - (A-1) \cdot g_{m4} r_{o4}} \approx \frac{-1}{(A-1) \cdot g_{m4}} \quad (6)$$

Equations 5 and 6 indicate that A must be safely larger than one to have positive feedback from both upper and lower sides of the tank. This justifies utilizing a 1:2 step-up transformer in the oscillator's tank. Note that one skilled in the art will recognize that transformers having higher turns ratios can be used as well.

As shown in FIG. 5, the $G_B$ oscillation voltage is high within the first half-period. Thus, only $M_2$ and $M_3$ transistors are on and the current flows from the left side of the tank to right side of the tank. Transistors $M_1$ and $M_4$, however, are turned on for the second half-period and the current direction of the tank is reversed. Consequently, like in the push-pull structure (i.e. $OSC_{NP}$), the tank current flow is reversed every half-period thus doubling the oscillator's $\alpha_I$ to $4/\pi$.

The minimum V is determined by the bias voltage $V_B$, $$V_{DDmin} \approx V_B = V_{OD1} + V_{gs3}. \quad (7)$$

Equation 7 implies that, during the times they are on, transistors $M_{3,4}$ should work in weak-inversion (or sub-threshold) keeping $V_{gs3} < V_t$ to achieve a lower $V_{DDmin}$. Since transistors $M_{1-4}$ experience the same DC gate voltage levels, $M_{3,4}$ sub-threshold operation also offers enough $V_{OD}$ for the switching current source devices to operate in the saturation region at the DC operating point. Thus, unlike traditional oscillators, the dimension of $M_{3,4}$ devices is preferably a few times larger (e.g., four or eight) than current source devices to guarantee their weak-inversion operation. On the other hand, the oscillation swing preferably does not go further than $V_{OD1,2}$ at the DA/DB nodes, which is chosen to be ~150 mV to satisfy the system's phase noise requirement by a margin of a several dB. Consequently, as with $OSC_N$, the oscillator structure of the present invention can operate at $V_{DD}$ as low as 0.5 V.

In some cases, such a low $V_{DD}$ and oscillation swing can lead to start-up problems and cause an increase in the oscillator buffer power consumption ($P_{Buf}$) in order to provide a rail-to-rail swing of the LO output. The gain of the transformer in the tank circuit, however, enhances the oscillation swing at the gates of devices $M_{1,2}$ to above $V_{DD}$, thereby guaranteeing oscillator start-up and a reduction of $P_{Buf}$. Furthermore, transistors $M_{1-4}$ contribution to the oscillator's PN is also reduced by the transformer's voltage gain.

Transistors $M_1$ and $M_2$ alternatively enter the triode region for part of the oscillation period, as shown in FIG. 5 Devices $M_{3,4}$, however, operate only in the saturation region (when not turned off) and exhibit negative output resistance for their entire on-state operation. Consequently, only one side of the tank is connected to the AC ground when either $M_1/M_2$ is in the linear region while the other side sees high impedance. Thus, this structure preserves the tank's charge and Q-factor over the entire oscillation period. Contrary to traditional oscillators, the tank loading effect due to the low output impedance of the current source transistor is not an issue in the oscillator architecture of the present invention.

Note that dynamically switching the bias of MOS devices will reduce their flicker noise. It also lessens the DC component of their effective impulse sensitivity function. Consequently, a lower $1/f^3$ PN corner is expected than in traditional oscillators. Furthermore, the $V_{DD}$ variation cannot directly modulate $V_{gs}$ and thus nonlinear $C_{gs}$ of $M_{1-4}$ devices. An RC filter (resistor 42, capacitor 44) is also placed between $V_{DD}$ and $V_B$ to further reduce the supply noise or ripples on the bias voltage. Hence, the frequency pushing should be very small, thus making it suitable for direct connection to solar cells and integration with power amplifiers.

Figure 4B:
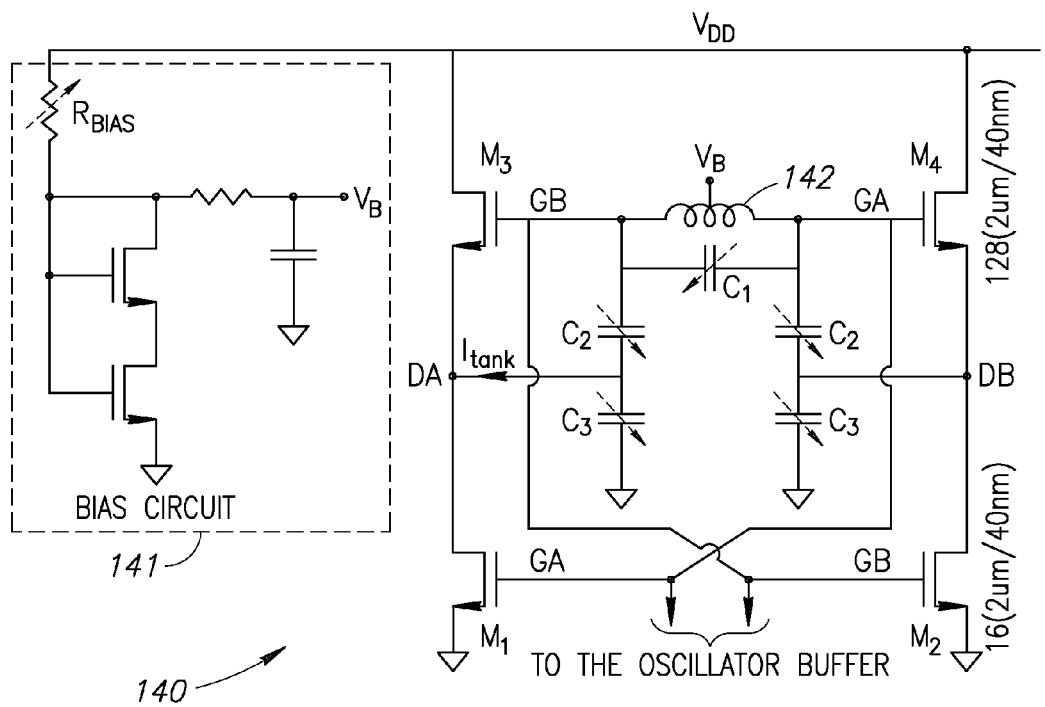
FIG. 4B is a schematic diagram illustrating a third example oscillator of the present invention.

A schematic diagram illustrating a third example oscillator of the present invention is shown in FIG. 4B. The oscillator circuit, generally referenced 140, comprises transistors $M_1$, $M_2$, $M_3$ and $M_4$ of a similar type (e.g., all four NMOS or PMOS), a passive voltage gain LC tank consisting of inductor 142 and capacitors $C_1$, $C_2$, $C_3$ and a bias circuit 141. $M_1$ and $M_2$ make up a lower pair of transistors and $M_3$ and $M_4$, make up an upper pair of transistors. The lower pair is closer to ground while the upper pair is closer to $V_{DD}$. The upper and lower pairs are stacked one on the other with their gate terminals cross-coupled to each other, i.e. the gates of $M_2$ and $M_3$ coupled to each other and the gates of $M_1$ and $M_4$ coupled to each other. To realize positive feedback for both upper and lower transistor pairs, a passive voltage gain is needed between the DA/DB nodes towards the GB/GA nodes. In this embodiment, the voltage gain is realized using a capacitive divider as described in detail supra in connection with FIG. 3D. Otherwise, operation of the oscillator 140 is similar to that of oscillator 40 of FIG. 4A described supra.

Figure 4C:
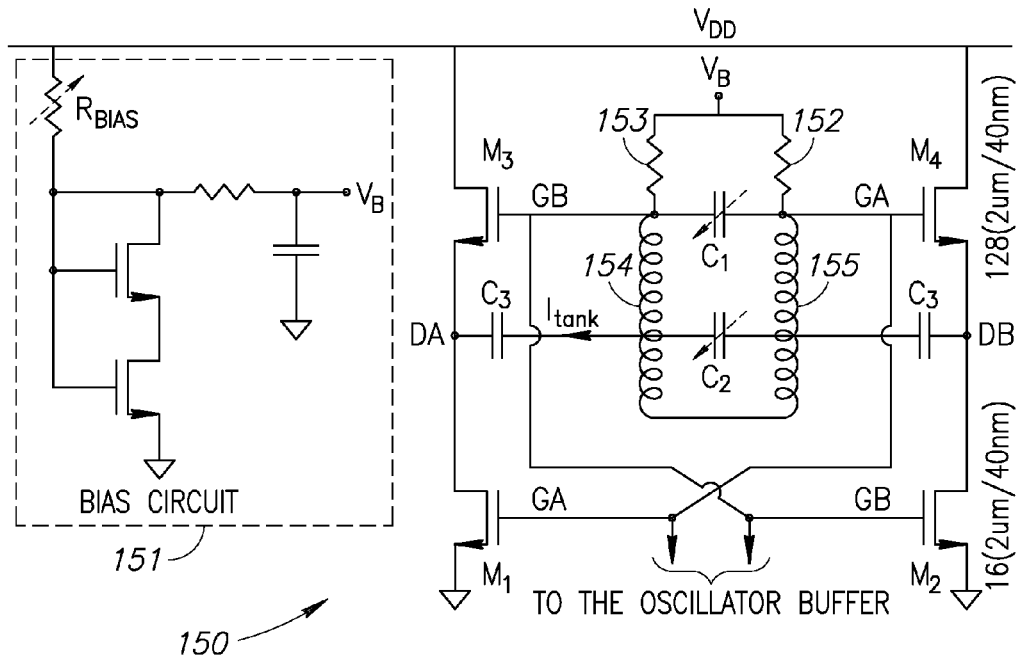
FIG. 4C is a schematic diagram illustrating a fourth example oscillator of the present invention.

A schematic diagram illustrating a fourth example oscillator of the present invention is shown in FIG. 4C. $M_1$ and $M_2$ make up a lower pair of transistors and $M_3$ and $M_4$, make up an upper pair of transistors. The lower pair is closer to ground while the upper pair is closer to $V_{DD}$. The upper and lower pairs are stacked one on the other with their gate terminals cross-coupled to each other, i.e. the gates of $M_2$ and $M_3$ coupled to each other and the gates of $M_1$ and $M_4$ coupled to each other. To realize positive feedback for both upper and lower transistor pairs, a passive voltage gain is needed between the DA/DB nodes towards the GA/GB nodes. Here, the voltage gain is realized using an autotransformer as described in detail supra in connection with FIG. 3C. Otherwise, operation of the oscillator 150 is similar to that of oscillator 40 of FIG. 4A described supra.

Figure 4D:
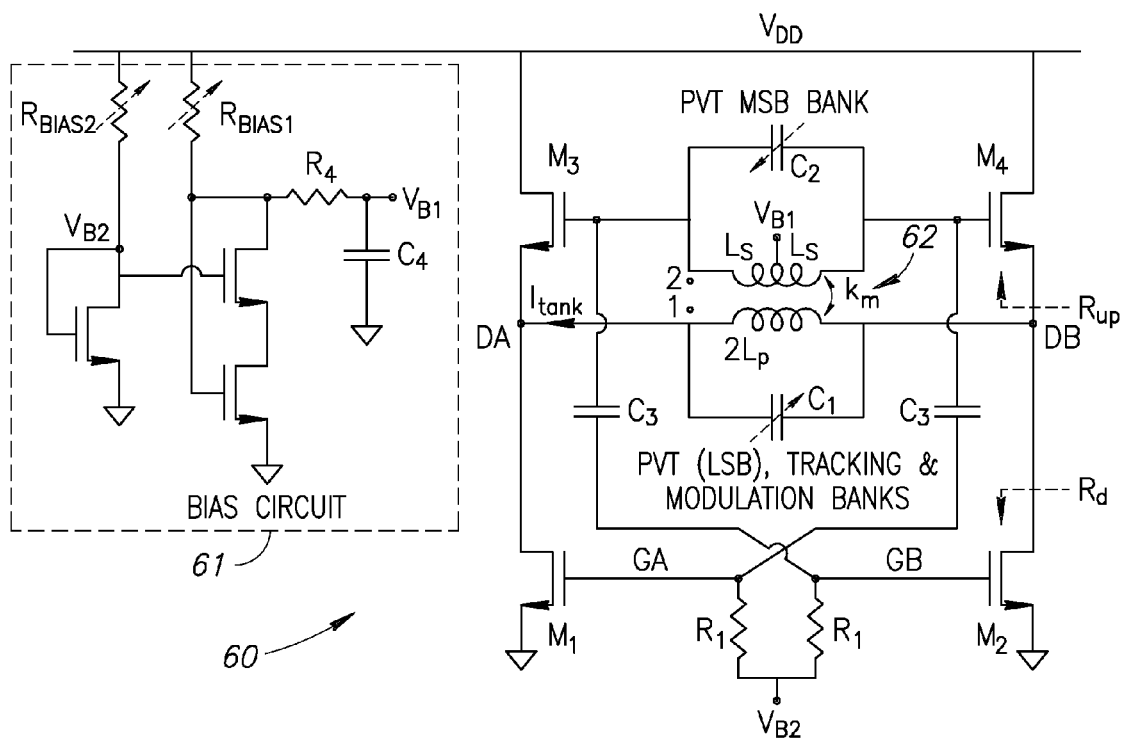
FIG. 4D is a schematic diagram illustrating a fifth example oscillator of the present invention.
Figure 4E:
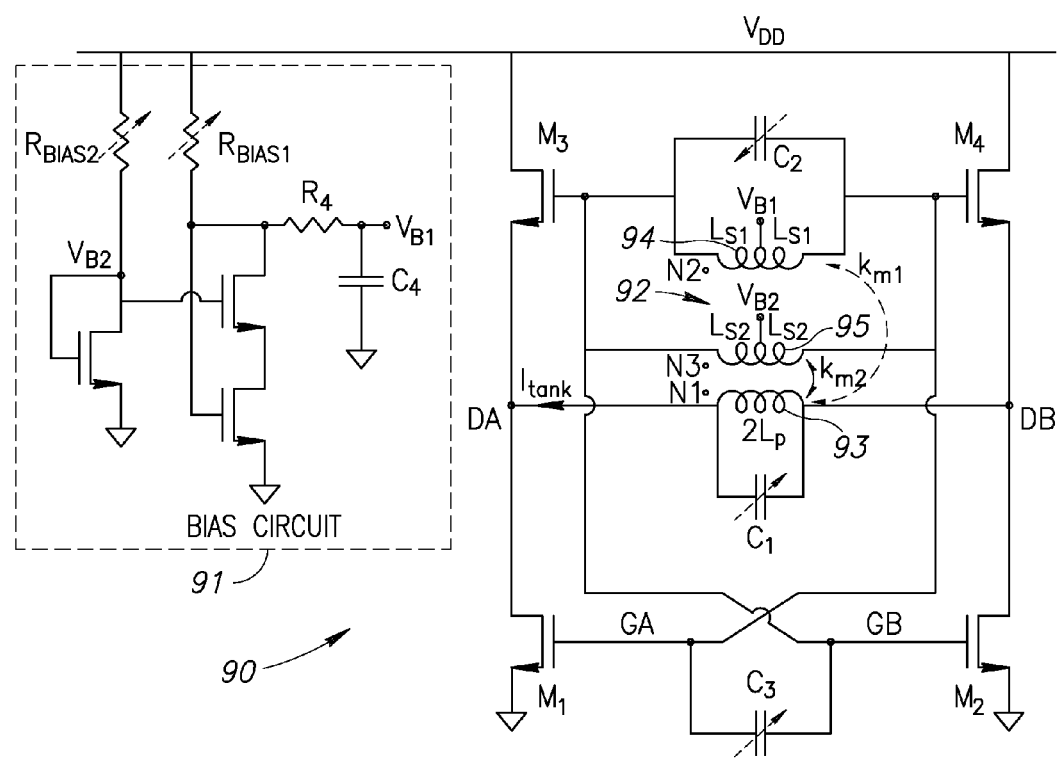
FIG. 4E is a schematic diagram illustrating a sixth example oscillator of the present invention.

It is noted that for supply voltages larger than 0.7 to 0.8 V, it is beneficial for the phase noise performance of the oscillator to have different gate DC voltage for the upper and lower gate voltages. In this manner, the lower pair can be forced to work in saturation for the entire oscillation period and prevent tank loading even at higher supply voltage. FIGS. 4D and 4E described infra illustrate schematics of such oscillators.

A schematic diagram illustrating a fifth example oscillator of the present invention is shown in FIG. 4D. $M_1$ and $M_2$ make up a lower pair of transistors and $M_3$ and $M_4$, make up an upper pair of transistors. The lower pair is closer to ground while the upper pair is closer to $V_{DD}$. The upper and lower pairs are stacked one on the other with their gate terminals coupled to each other.

The DC gate voltage of the lower pair is isolated from that for the upper pair by DC blocking capacitors $C_3$. The bias of the lower pair is then applied separately through resistors $R_1$. The value of $R_1$ is preferably more than a few kilo Ohms to avoid tank loading. Advantageously, the AC level of the oscillation voltage can also be adjusted independently for lower and upper pairs. This gives the designer another degree of freedom to ensure both transistor pairs operate only in cut-off and saturation during the entire oscillation period.

Here, the gates of $M_2$ and $M_3$ and the gates of $M_1$ and $M_4$ are AC coupled to each other via capacitors $C_3$. Thus, the secondary $L_S$ of transformer 62 can be connected to a first bias voltage $V_{B1}$, the gates of $M_2$ and $M_3$ as well as the gates of $M_1$ and $M_4$ connected to a second bias voltage $V_{B2}$. To realize positive feedback for both upper and lower transistor pairs, a passive voltage gain is needed between the DA/DB nodes towards the GA/GB nodes. Here, the voltage gain is realized using a transformer 62 as described in detail supra in connection with FIG. 3B. Otherwise, operation of the oscillator 60 is similar to that of oscillator 40 of FIG. 4A described supra.

A schematic diagram illustrating a sixth example oscillator of the present invention is shown in FIG. 4E. $M_1$ and $M_2$ make up a lower pair of transistors and $M_3$ and $M_4$, make up an upper pair of transistors. The lower pair is closer to ground while the upper pair is closer to $V_{DD}$. The upper and lower pairs are stacked one on the other.

The DC gate voltage of the lower pair is isolated from that for the upper pair. The DC bias of lower and upper pairs is isolated utilizing a tertiary coil 95 (i.e. second secondary winding) for the transformer 92. Hence, the DC bias $V_{B2}$ of the lower pair is applied to the center tap of the tertiary winding 95 of the transformer. Advantageously, the AC level of the oscillation voltage can be adjusted independently for lower and upper pairs. This gives the designer another degree of freedom to ensure both pairs operate only in cut-off and saturation during the entire oscillation period.

The 180 degree phase shift on the tertiary winding 95 could be realized either by winding direction reversal (not shown) or by reversing the gate terminals of $M_{1,2}$ (shown). Here, the gates of $M_2$ and $M_3$ are magnetically coupled to each other with the same polarity and the gates of $M_1$ and $M_4$ are magnetically coupled to each other with the same polarity via tertiary winding 95 of the three winding transformer 92. The two secondary windings 94 and 95 (a/k/a. tertiary) can be biased independently with different biasing voltages $V_{B1}$, $V_{B2}$, respectively. To realize positive feedback for both upper and lower transistor pairs, a passive voltage gain is needed between the DA/DB nodes towards the GB/GA nodes. Here, the voltage gain is realized using a transformer as described in detail supra in connection with FIG. 3B. Otherwise, operation of the oscillator 90 is similar to that of oscillator 40 of FIG. 4A described supra.

Figure 6:
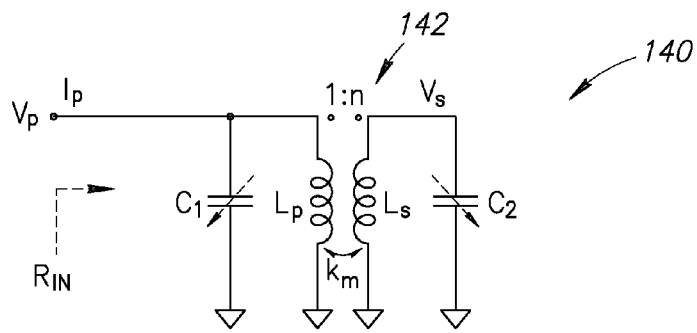
FIG. 6 is a schematic diagram illustrating an example transformer based LC tank circuit.
Figure 7:
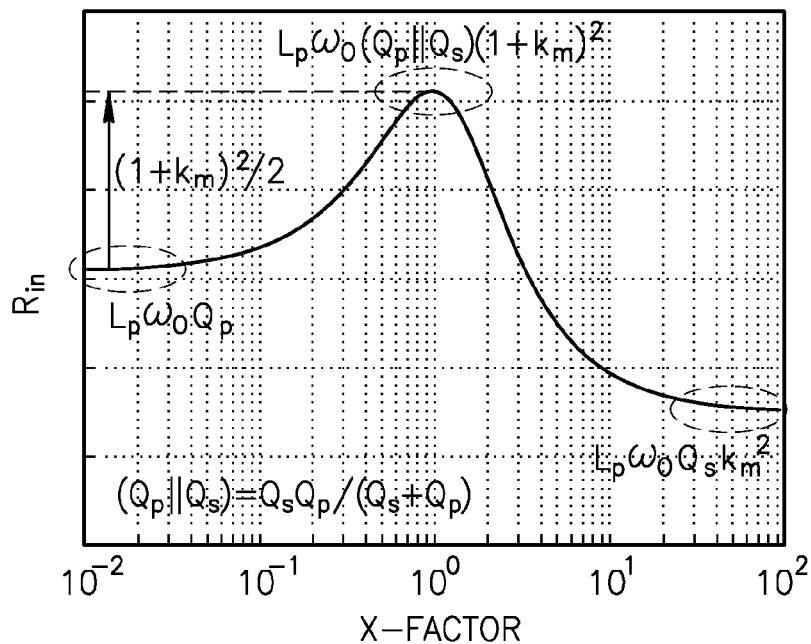
FIG. 7 is a graph illustrating transformer-based equivalent input parallel resistance.
Figure 8:
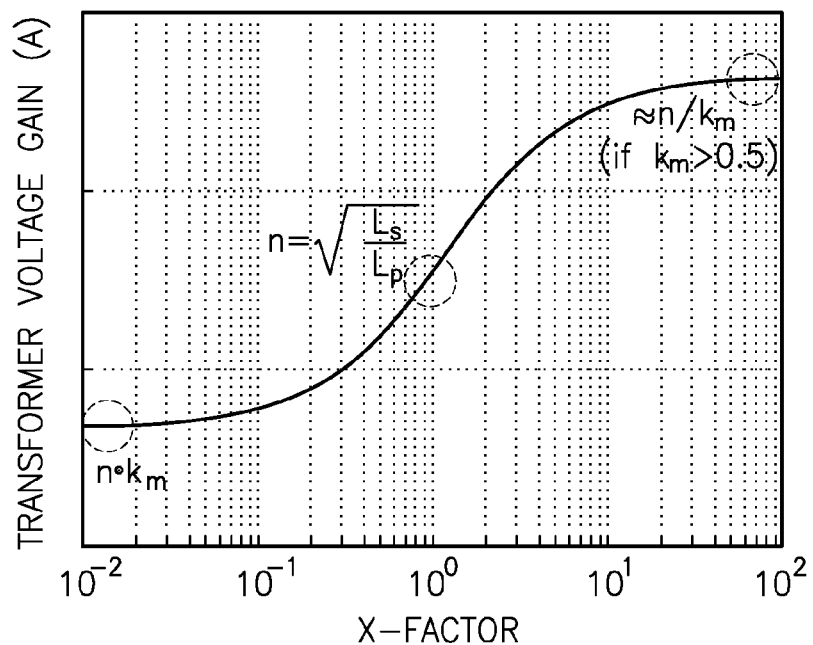
FIG. 8 is a graph illustrating transformer-based tank voltage gain.
Figure 9:
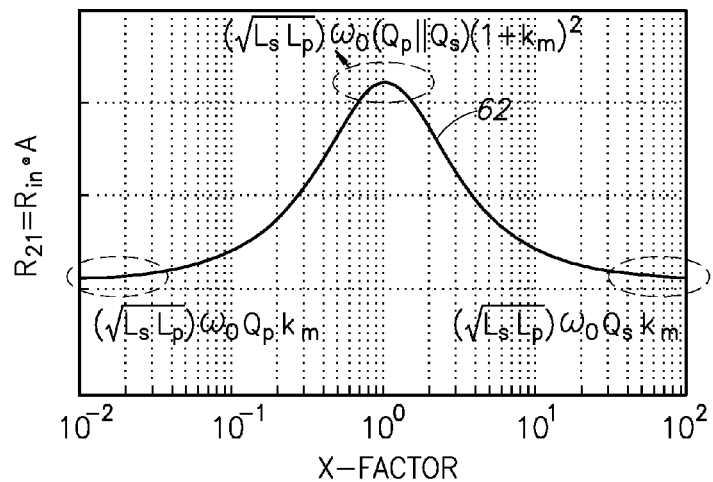
FIG. 9 is a graph illustrating transformer-based tank transimpedance $R_{21}$ versus X-factor.

A schematic diagram of a half-circuit illustrating an example transformer based LC tank circuit is shown in FIG. 6. The circuit, generally referenced 140, comprises an LC tank including transformer 142 having a 1:n turns ratio (e.g., n=2), tuning capacitor $C_1$ connected across the primary of the transformer and tuning capacitor $C_2$ connected across the secondary of the transformer. In addition, $R_{in}=V_p/I_p$; $A=V_s/N_p$; and $R_{21}=V_s/I_p$. A graph illustrating transformer-based equivalent input parallel resistance is shown in FIG. 7. A graph illustrating transformer-based tank voltage gain is shown in FIG. 8. A graph illustrating transformer-based tank transimpedance $R_{21}$ versus X-factor is shown in FIG. 9.

Note further that larger $R_{in}$ and A are desired to reduce $P_{DC}$ and $P_{Buf}$, respectively. Both optimization parameters are a strong function of $X=L_s C_2/L_p C_1$, as shown in FIGS. 7 and 8. $R_{in}$ is enhanced by a factor of $(1+k_m)^2/2$ at X=1 for $Q_p \approx Q_s$, which is reasonable for monolithic transformers. Gain A, however, increases by having a larger X-factor as gathered from FIG. 8. To consider both scenarios, transimpedance $R_{21}=R_{in} \cdot A$ term is defined and depicted in FIG. 9. The $R_{21}$ also reaches its maximum at X=1. For this reason, the PVT switched-MOM-capacitor banks are distributed between the transformer's primary and secondary to roughly satisfy this criterion. The maximum of $R_{21}$ is also defined as the transformer figure of merit $$FoM=(Q_p||Q_s) \cdot (1+k_m)^2 \cdot \sqrt{L_p L_s} \cdot \omega_0 \qquad (8)$$

Consequently, the transformer dimension and winding spacing are chosen to maximize this term. Note that thinner lower metal layers are preferably used for the cross connections as the number of primary turns increases in a step-up transformer. That constraint increases the transformer's losses and degrades the tank's Q-factor and $R_{in}$. Consequently, the maximum achievable $R_{in}$ is somewhat smaller for the transformer-based tank as compared to a simple LC resonator given the same CMOS technology.

In an example implementation of the oscillator constructed by the inventors, the oscillator exhibits a tuning range of approximately 22.5% from 4 to 5 GHz. The FoM has a maximum of 189.9 dBc at $f_{max}$ and varies about 1 dB across the tuning range. The oscillator also exhibits very low frequency pushing of 18 and 12 MHz/V at $f_{max}$ and $f_{min}$, respectively.

The measured phase noise of the transformer based switching current source oscillator of the present invention at the lowest frequency $f_{min}$ and highest frequency $f_{max}$ with $V_{DD}$ of 0.5 V and $P_{DC}$ of 470 and 580 µW, respectively. Due to the switching current source technique of the present invention, 1/f³ PN corner of the oscillator is relatively low and varies between 250 to 420 kHz across the tuning range.

Figure 10:
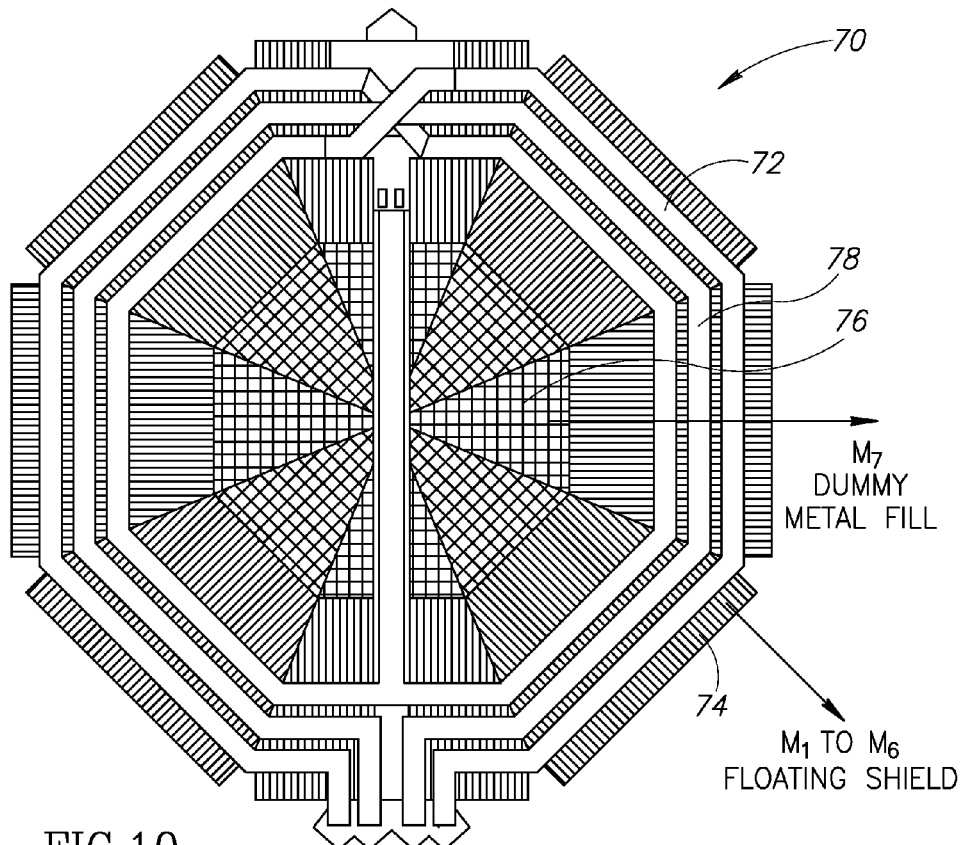
FIG. 10 is a diagram illustrating a layout of an example transformer of the present invention fabricated in CMOS.

A diagram illustrating a top-view layout example of the transformer of the present invention fabricated in CMOS is shown in FIG. 10. The die area of 40 nm CMOS prototype is 0.14 mm².

Example Applications of the Current Switching Oscillator

Several applications of the current switching oscillator of the present invention as a frequency generator will now be described.

Figure 11:
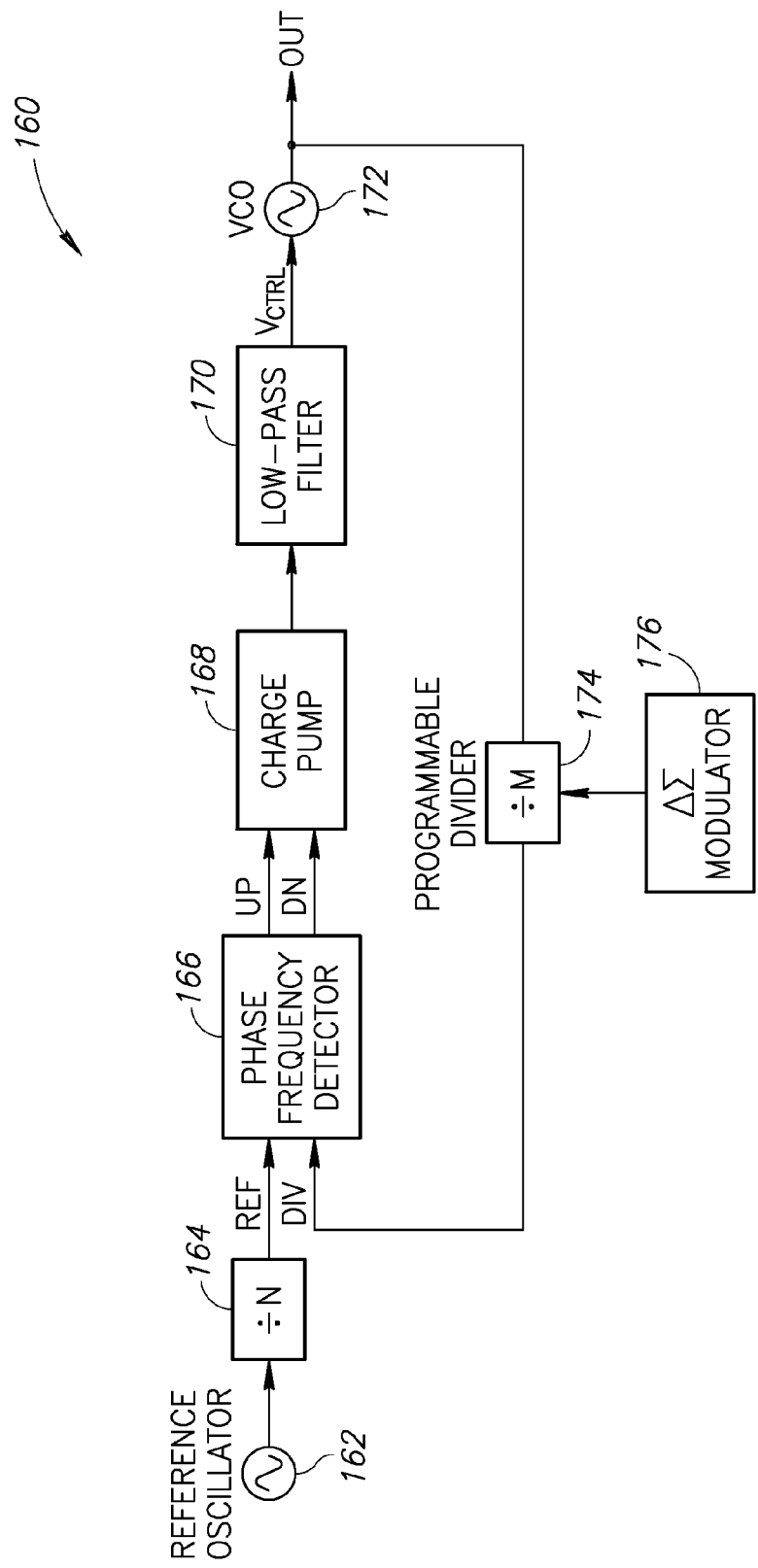
FIG. 11 is a block diagram illustrating an example phase locked loop incorporating the oscillator of the present invention.

A block diagram illustrating an example phase locked loop (PLL) incorporating the oscillator of the present invention is shown in FIG. 11. The PLL, generally referenced 160, comprises a reference oscillator 162, ÷N divider 164, phase/frequency detector 166, charge pump 168, low pass filter 170, voltage controlled oscillator (VCO) 172 incorporating the oscillator of the present invention, programmable÷M divider 174 and ΣΔ modulator 176.

Figure 12:
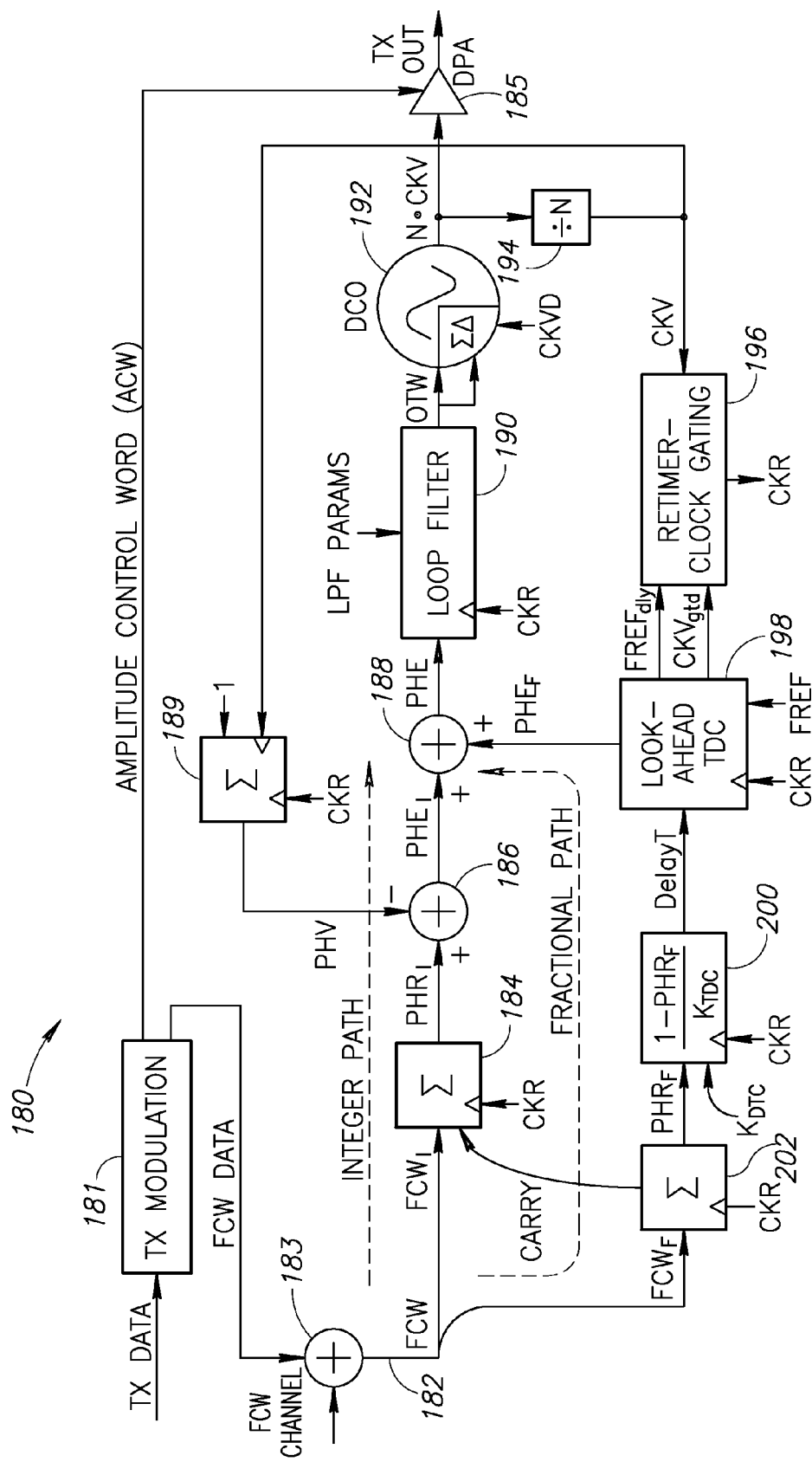
FIG. 12 is a block diagram illustrating an example all digital phase locked loop incorporating the oscillator of the present invention.

A block diagram illustrating an example all digital phase locked loop (ADPLL) incorporating the oscillator of the present invention is shown in FIG. 12. The frequency command word (FCW) 182 is split into its integer $FCW_I$ and fractional $FCW_F$ parts, with separate reference accumulators 184, 202 that generate the integer and fractional part of the reference phase, $PHR_I$ and $PHR_F$, respectively. In order to properly accumulate the FCW as a whole, a carry is transferred to the integer accumulator whenever an overflow of the fractional part occurs. A synchronous 8-bit counter serves as the variable accumulator 189 and produces the variable phase PHV that is subtracted from $PHR_1$ via subtractor 186 to provide the integer part of the phase error $PHE_I$. $PHR_F$ is used to calculate the "look-ahead TDC" delay code based on the estimated delay characteristic of the look-ahead TDC (i.e., a combination of a digital-to-time converter followed by a TDC), which in turn is applied to the look-ahead TDC 198 through a gain. A look-ahead TDC gain estimation block 200, based on an iterative adaptation algorithm, is implemented on chip to dynamically track delay estimation errors due to PVT variations. The digitized output of the TDC represents the fractional part of the phase error, $PHE_F$, that is combined with $PHE_I$ via summer 188 to yield the total fixed-point representation of the phase error PHE.

The phase error PHE is then filtered via loop filter 190, in order to properly set the dynamics of the loop. A reconfigurable proportional integral controller within the loop filter block 190 is followed by a DCO decoder also within the loop filter block 190 to generate the oscillator tuning word (OTW). The DCO 192 comprises the DCO circuit described supra and includes switched capacitor banks that are dithered using a $2^{nd}$-order MASH ΣΔ modulator in order to achieve a finer equivalent frequency resolution and push the quantization noise at higher offset frequencies where they are more easily filtered out and do not contribute significantly to the total jitter. The operation frequency of the ΣΔ modulators can be dynamically selected between different divider versions of the oscillator output in order to meet the required performance as a trade-off between power consumption and jitter.

The transmit (TX) modulation data is input to TX modulation block 181 which functions to generate the amplitude control word (ACW) and the data frequency control word (FCW). The ACW is input to the digital power amplifier (DPA) 185 which modulates the amplitude of the signal output of the DCO. The FCW data is summed with the FCW channel at adder 183 and the resultant main (channel) FCW 182 is then split into integer and fractional parts as described supra.

In one embodiment, the feedback path was chosen to operate at a maximum 2.5 GHz, which means that a divide-by-two version of the DCO output is fed back to the variable accumulator and the look-ahead TDC. Division by two is achieved using a CMOS digital divider. These dividers are represented in FIG. 12 by the ÷N block 194. Since the loop feedback operates on a divided version of the output, the effective frequency command word is adjusted accordingly. Therefore, one half of the multiplication ratio is accumulated at the ADPLL.

As mentioned supra, the retimer clock gating circuit 196 generates the clock signals for the ADPLL. The CKR clock is used as a global digital clock of the ADPLL loop (at the reference clock rate) to resample the output of the variable accumulator and to generate a gated version of the variable feedback clock $CKV_{gtd}$.

Figure 13:
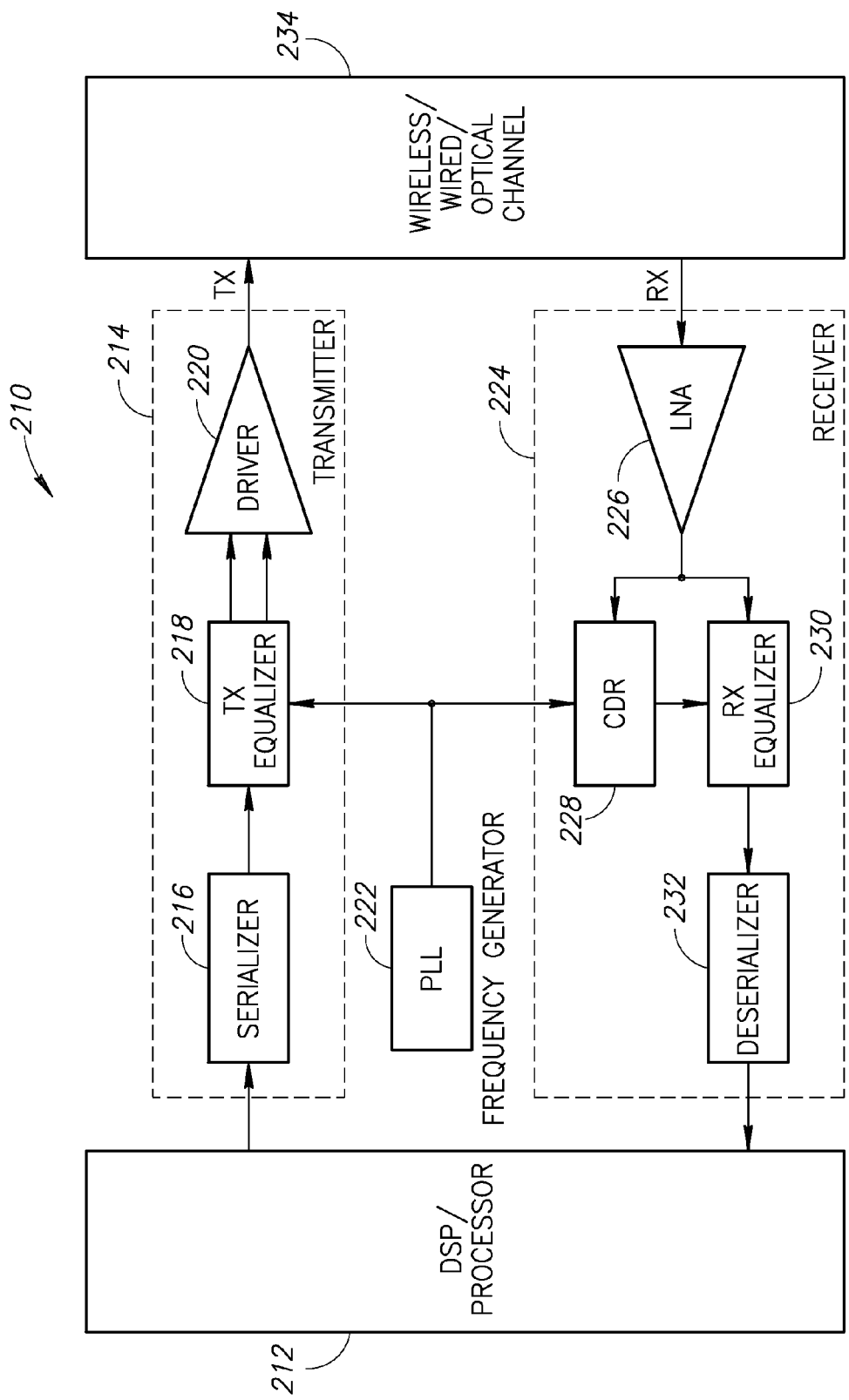
FIG. 13 is a block diagram illustrating an example wireline transceiver incorporating the oscillator of the present invention.

A block diagram illustrating an example wireline transceiver incorporating the oscillator of the present invention is shown in FIG. 13. The transceiver, generally referenced 210, comprises a DSP/processor (including a baseband processor in one embodiment) 212, transmitter 214, receiver 224, PLL based frequency generator 222 and the channel (e.g., wireline) 234. Note that a person skilled in the art can modify the transceiver 210 to operate as a wireless transceiver.

In this example embodiment, the frequency generator 222 comprises the current switching oscillator based DCO as described supra. In another embodiment, the frequency generator may comprise the ADPLL circuit described supra in connection with FIG. 12. The current switching oscillator offers ultra low power and voltage operation.

Mobile Device Incorporating the Current Switching Oscillator Based DCO

Figure 14:
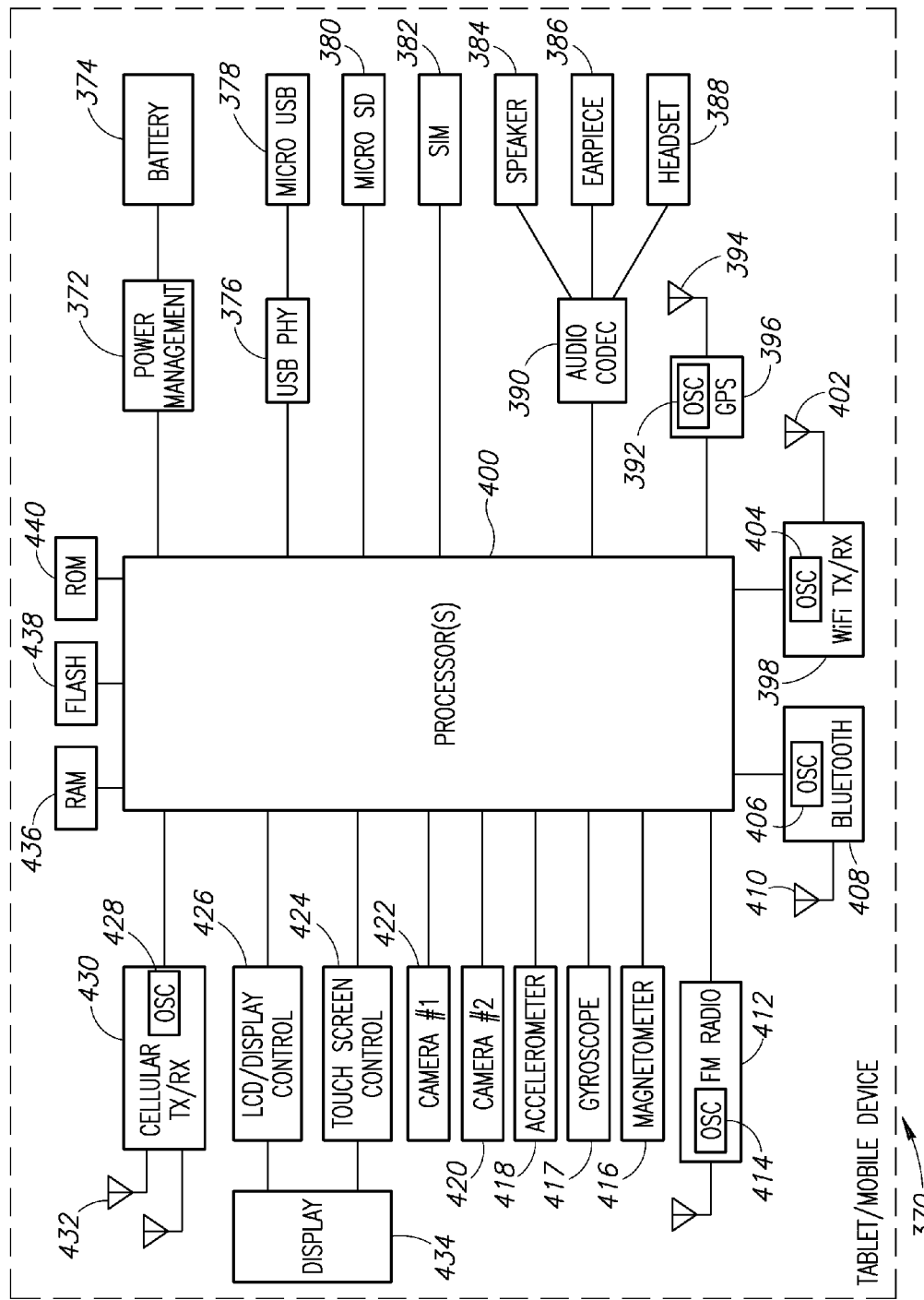
FIG. 14 is a block diagram illustrating an example mobile device incorporating the oscillator of the present invention.

A block diagram illustrating an example tablet/mobile device incorporating a frequency generator that includes the current switching oscillator based DCO circuit of the present invention is shown in FIG. 14. The mobile device is preferably a two-way communication device having voice and/or data communication capabilities. In addition, the device optionally has the capability to communicate with other computer systems via the Internet. Note that the mobile device may comprise any suitable wired or wireless device such as multimedia player, mobile communication device, digital still or video camera, cellular phone, smartphone, iPhone, PDA, PNA, Bluetooth device, tablet computing device such as the iPad or other iOS device, Android device, Surface, Nexus, Google Glass, etc. For illustration purposes only, the device is shown as a mobile device, such as a cellular based telephone, smartphone or superphone. Note that this example is not intended to limit the scope of the mechanism as the invention can be implemented in a wide variety of communication devices. It is further appreciated the mobile device shown is intentionally simplified to illustrate only certain components, as the mobile device may comprise other components and subsystems beyond those shown.

The mobile device, generally referenced 370, comprises one or more processors 400 which may comprise a baseband processor, CPU, microprocessor, DSP, etc., optionally having both analog and digital portions. The mobile device may comprise a plurality of cellular radios 430 and associated antennas 432. Radios for the basic cellular link and any number of other wireless standards and Radio Access Technologies (RATs) may be included. Examples include, but are not limited to, Third Generation (3G) Long Term Evolution (LTE), Code Division Multiple Access (CDMA), Personal Communication Services (PCS), Global System for Mobile Communication (GSM)/GPRS/EDGE 3G; WCDMA; WiMAX for providing WiMAX wireless connectivity when within the range of a WiMAX wireless network; Bluetooth for providing Bluetooth wireless connectivity when within the range of a Bluetooth wireless network; WLAN for providing wireless connectivity when in a hot spot or within the range of an ad hoc, infrastructure or mesh based wireless LAN (WLAN) network; near field communications; UWB; GPS receiver for receiving GPS radio signals transmitted from one or more orbiting GPS satellites, FM transceiver provides the user the ability to listen to FM broadcasts as well as the ability to transmit audio over an unused FM station at low power, such as for playback over a car or home stereo system having an FM receiver, digital broadcast television, etc.

The mobile device may also comprise internal volatile storage 436 (e.g., RAM) and persistent storage 440 (e.g., ROM) and flash memory 438. Persistent storage 436 also stores applications executable by processor(s) 400 including the related data files used by those applications to allow device 370 to perform its intended functions. Several optional user-interface devices include trackball/thumbwheel which may comprise a depressible thumbwheel/trackball that is used for navigation, selection of menu choices and confirmation of action, keypad/keyboard such as arranged in QWERTY fashion for entering alphanumeric data and a numeric keypad for entering dialing digits and for other controls and inputs (the keyboard may also contain symbol, function and command keys such as a phone send/end key, a menu key and an escape key), headset 388, earpiece 386 and/or speaker 384, microphone(s) and associated audio codec 390 or other multimedia codecs, vibrator for alerting a user, one or more cameras and related circuitry 420, 422, display(s) 434 and associated display controller 426 and touchscreen control 424. Serial ports include a micro USB port 378 and related USB PHY 376 and micro SD port 380. Other interface connections may include SPI, SDIO, PCI, USB, etc. for providing a serial link to a user's PC or other device. SIM/RUIM card 382 provides the interface to a user's SIM or RUIM card for storing user data such as address book entries, user identification, etc.

Portable power is provided by the battery 374 coupled to power management circuitry 372. External power is provided via USB power or an AC/DC adapter connected to the power management circuitry that is operative to manage the charging and discharging of the battery. In addition to a battery and AC/DC external power source, additional optional power sources each with its own power limitations, include: a speaker phone, DC/DC power source, and any bus powered power source (e.g., USB device in bus powered mode).

Operating system software executed by the processor 400 is preferably stored in persistent storage (i.e. ROM 440), or flash memory 438, but may be stored in other types of memory devices. In addition, system software, specific device applications, or parts thereof, may be temporarily loaded into volatile storage 436, such as random access memory (RAM). Communications signals received by the mobile device may also be stored in the RAM.

The processor 400, in addition to its operating system functions, enables execution of software applications on the device 370. A predetermined set of applications that control basic device operations, such as data and voice communications, may be installed during manufacture. Additional applications (or apps) may be downloaded from the Internet and installed in memory for execution on the processor. Alternatively, software may be downloaded via any other suitable protocol, such as SDIO, USB, network server, etc.

Other components of the mobile device include an accelerometer 418 for detecting motion and orientation of the device, gyroscope 417 for measuring or maintaining orientation, magnetometer 416 for detecting the earth's magnetic field, FM radio 412 and antenna 413, Bluetooth radio 408 and antenna 410, Wi-Fi radio 398 including antenna 402 and GPS 392 and antenna 394.

In accordance with the invention, the mobile device 370 comprises one or more oscillator circuits, each incorporating the current switching oscillator circuit of the present invention. Numerous embodiments of the mobile device 370 may comprise an oscillator circuit 428 as described supra incorporated in the one or more cellular radios 430; as oscillator circuit 414 as described supra incorporated in the FM radio 412; an oscillator circuit 406 as described supra incorporated in the Bluetooth radio 408; an oscillator circuit 404 as described supra incorporated in the Wi-Fi radio 398; and an oscillator circuit 396 as described supra incorporated in the GPS radio 392.

Internet of Things (IoT) Node Incorporating the Current Switching Oscillator Based DCO The Internet of Things (IoT) is defined as the network of physical objects or "things" embedded with electronics, software, sensors and network connectivity, which enables these objects to collect and exchange data. The IoT allows objects to be sensed and controlled remotely across existing network infrastructure, creating opportunities for more direct integration between the physical world and computer-based systems, and resulting in improved efficiency, accuracy and economic benefit. Each thing is uniquely identifiable through its embedded computing system but is able to interoperate within the existing Internet infrastructure. Experts estimate that the IoT will consist of almost 50 billion objects by 2020.

Figure 15:
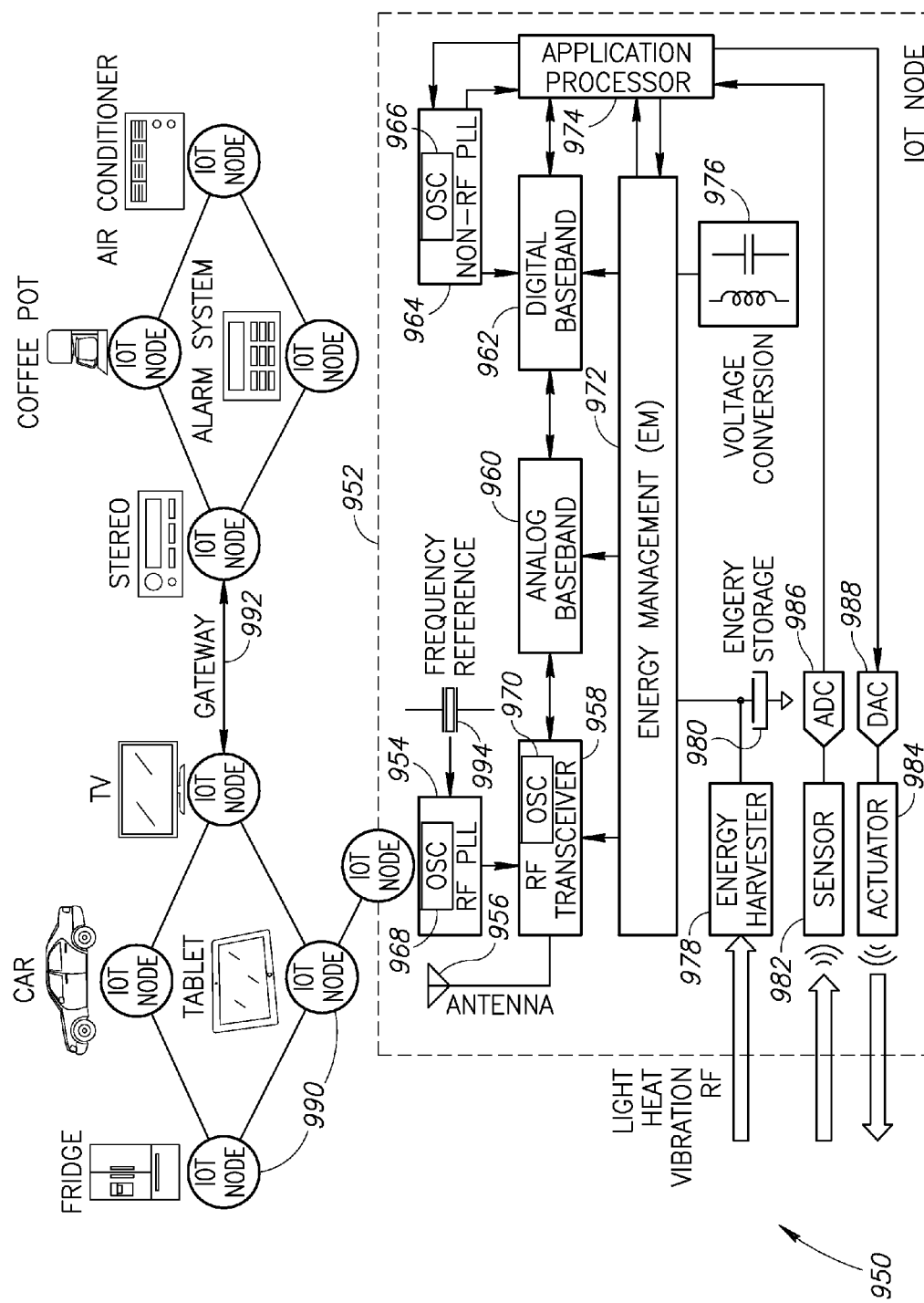
FIG. 15 is a block diagram illustrating an example IoT node incorporating the oscillator of the present invention.

A block diagram illustrating an example IoT node incorporating the oscillator of the present invention is shown in FIG. 15. The example IoT, generally referenced 950, comprises a plurality of IoT nodes 990. The architecture of an example IoT node 952 shown can be fully integrated as a System on Chip (SoC) on a single IC chip in nanoscale CMOS. It contains the radio subsystem to wirelessly communicate with other nodes and gateways, application processor to impart a certain amount of local "intelligence", sensor and an optional actuator to interface with the environment and energy management to harvest energy (light, heat, vibration or RF power) from the environment and/or convert the voltage levels to those required by the functional circuitry. The RF and non-RF frequency synthesizers provide local oscillator and processor clocks, respectively. A frequency reference provides a fixed clock with excellent long term stability to the frequency synthesizers. In one embodiment, the oscillator of the present invention described supra is incorporated in the RF synthesizer 954 as block 968; non-RF synthesizer 964 as block 966; and/or RF transceiver 958 as block 970.

The RF transceiver 958 interfaces with an antenna 956. The RF signals on the order of 100's of MHz up to several GHz are upconverted and downconverted there to the lower (i.e. baseband) frequencies, which are then processed in the analog baseband circuitry 960. The conversion from analog to digital (i.e. ADC), and vice versa (i.e. DAC), is also performed there. The digital baseband completes the physical layer of a chosen communication standard. The application processor performs various control and signal processing functions and is responsible for giving a level of "intelligence" to the IoT node.

The RF frequency synthesizer 954 is realized as an all-digital PLL (ADPLL) and provides a local oscillator signal to the RF transceiver 958. The non-RF frequency synthesizer 964 provides clocks to the digital baseband 962 and application processors 974. The clock frequency has to be dynamically switchable in response to the changing computational load conditions. The energy management (EM) circuitry 972 provides energy conversion between the energy harvester 978 and/or low-capacity storage battery or a super-capacitor 980 and all the IoT functional circuits. The EM circuit carries out several functions. First, it boosts the voltage from the energy harvester (e.g., light, heat, vibration, RF electromagnetic, etc.) to that required by the nanoscale CMOS circuits, which is in the range of 0.7 to 1.0 V assuming 40 nm CMOS technology. This is performed by a dedicated DC-DC boost converter 976. Second, it down-shifts the energy from an optional battery, which is on the order of 1.5 to 3.6 V to that required by the nanoscale CMOS circuits. This is performed by a dedicated DC-DC buck converter 976. Third, both boost and buck converters use energy storage passive devices, i.e. capacitor or inductor for storing electrical and magnetic energy, respectively, in order to change the voltage level with high efficiency. The high conversion efficiency must be maintained across the entire range of the allowed loads. Fourth, the EM needs to provide many power supply domains. This is dictated by the different voltage level requirements during voltage scaling. Fifth, the EM supply domains preferably provide individually adjustable voltage levels. The supply voltage level of digital logic circuits widely vary depending on the fast changing real time computational load conditions, while the voltage level of digital RF and analog circuits experience less of such variance, and mainly due to temperature and operating frequency, as well as communication channel conditions. Moreover, the analog circuits have to be properly biased, which normally prevents them from operating at near-threshold conditions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An oscillator circuit, comprising:
   a lower pair of transistors;
   an upper pair of transistors, each transistor in said upper pair stacked on a respective transistor in said lower pair, a gate terminal of each transistor in said upper pair coupled with a respective gate terminal of transistors in said lower pair;
   an LC-tank circuit coupled between the gate terminals of the transistors in said upper pair and drain terminals of said lower pair, said LC-tank circuit operative to exhibit a passive voltage gain; and
   wherein said upper pair of transistors and said lower pair of transistors are operative to cause current through said LC-tank to reverse direction every half period.

2. The oscillator circuit according to claim 1, wherein said coupling comprises at least one of direct electrical connections, AC coupling and magnetic coupling.

3. The oscillator circuit according to claim 1, wherein said LC-tank comprises at least one of a transformer, an autotransformer and a capacitive divider.

4. The oscillator circuit according to claim 1, wherein said passive voltage gain is achieved using a capacitive voltage divider.

5. The oscillator circuit according to claim 1, wherein said passive voltage gain is achieved using an autotransformer.

6. The oscillator circuit according to claim 1, wherein said passive voltage gain is achieved using a transformer.

7. The oscillator circuit according to claim 1, wherein said lower pair of transistors and said upper pair of transistors comprise NMOS type transistors.

8. The oscillator circuit according to claim 1, wherein said lower pair of transistors and said upper pair of transistors comprise PMOS type transistors.

9. The oscillator circuit according to claim 1, wherein said lower transistor pair and said upper transistor pair are configured to provide positive feedback.

10. An oscillator circuit, comprising:
    a lower pair of transistors;
    an upper pair of transistors, each transistor in said upper pair stacked on a respective transistor in said lower pair, a gate terminal of each transistor in said upper pair coupled with a respective gate terminal of a transistor in said lower pair;
    a differential LC-tank circuit having a primary winding coupled between drain terminals of said lower pair transistors and a secondary winding coupled between the gate terminals of said lower pair transistors;
    a first tunable capacitor coupled across said primary winding;
    a second tunable capacitor coupled across said secondary winding; and
    wherein said upper pair of transistors and said lower pair of transistors are operative to cause current through said LC-tank to reverse direction every half period.

11. The oscillator circuit according to claim 10, wherein said cross-coupling comprises at least one of direct electrical connections, AC coupling and magnetic coupling.

12. The oscillator circuit according to claim 10, wherein said LC-tank comprises at least one of a transformer, an autotransformer and a capacitive divider.

13. The oscillator circuit according to claim 10, wherein said lower pair of transistors and said upper pair of transistors comprise NMOS type transistors.

14. The oscillator circuit according to claim 10, wherein said lower pair of transistors and said upper pair of transistors comprise PMOS type transistors.

15. The oscillator circuit according to claim 10, wherein said tank circuit including a transformer having a primary winding and a secondary winding and exhibiting a passive voltage gain.

16. An oscillator circuit, comprising:
    a lower pair of transistors;
    an upper pair of transistors, a source terminal of each transistor in said upper pair coupled to a drain terminal of a respective transistor in said lower pair, a gate terminal of each transistor in said upper pair coupled with a respective gate terminal of a transistor in said lower pair;

a differential LC-tank circuit including a transformer having a primary winding and a secondary winding and exhibiting a passive voltage gain, said primary winding coupled to drain terminals of said lower pair and said secondary winding coupled to the gate terminals of said upper and lower pairs of transistors;

a first tunable capacitor coupled across said primary winding;

a second tunable capacitor coupled across said secondary winding; and wherein said upper pair of transistors and said lower pair of transistors are operative to cause current through said LC-tank to reverse direction every half period.

17. The oscillator circuit according to claim 16, wherein said cross-coupling comprises at least one of direct electrical connections, AC coupling and magnetic coupling.

18. The oscillator circuit according to claim 16, wherein said LC-tank comprises at least one of a transformer, an autotransformer and a capacitive divider.

19. The oscillator circuit according to claim 16, wherein said lower pair of transistors and said upper pair of transistors comprise NMOS type transistors.

20. The oscillator circuit according to claim 16, wherein said lower pair of transistors and said upper pair of transistors comprise PMOS type transistors.

\* \* \* \* \*